United States Patent
Lee et al.

(10) Patent No.: US 11,337,326 B2
(45) Date of Patent: May 17, 2022

(54) ELECTRONIC DEVICE WITH A SWITCH TO PREVENT OVER-DISCHARGING OF DEVICE BATTERY

(71) Applicant: Samsung Electronics Co., Ltd., Suwon-si (KR)

(72) Inventors: Jung-Woo Lee, Seongnam-si (KR); Sung-Hoon Moon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 200 days.

(21) Appl. No.: 16/488,838

(22) PCT Filed: Feb. 28, 2018

(86) PCT No.: PCT/KR2018/002447
§ 371 (c)(1),
(2) Date: Aug. 26, 2019

(87) PCT Pub. No.: WO2018/159994
PCT Pub. Date: Sep. 7, 2018

(65) Prior Publication Data
US 2021/0136942 A1    May 6, 2021

(30) Foreign Application Priority Data
Mar. 2, 2017 (KR) .......................... 10-2017-0027378

(51) Int. Cl.
*H01H 27/00* (2006.01)
*H01H 27/04* (2006.01)
(Continued)

(52) U.S. Cl.
CPC ........... *H05K 5/0295* (2013.01); *H01H 27/00* (2013.01); *H01H 27/04* (2013.01); *H05K 5/0086* (2013.01); *H05K 5/0291* (2013.01)

(58) Field of Classification Search
CPC .... H05K 5/0295; H05K 5/0086; H01H 27/00; H01H 27/04; H04B 1/3818; H04B 1/3816
See application file for complete search history.

(56) References Cited

U.S. PATENT DOCUMENTS 2,239,426 A * 4/1941 Kimball ............... H01H 15/102
200/542
2,722,575 A * 11/1955 Dobkins ................ H01H 27/00
200/52 R (Continued)

FOREIGN PATENT DOCUMENTS

JP    2012-146489 A    8/2012
JP    2013-183634 A    9/2013

(Continued)

OTHER PUBLICATIONS

Korean Office Action dated Oct. 19, 2020, issued in the Korean Application of 10-2017-0027378.

(Continued)

*Primary Examiner* — Vanessa Girardi
(74) *Attorney, Agent, or Firm* — Jefferson IP Law, LLP

(57) ABSTRACT

An apparatus for preventing over-discharging according to various embodiments of the present invention may comprise: a housing including a first opening; a first electronic component disposed inside the housing; a second electronic component electrically connected to the first electronic component; and a switch for electrically connecting or disconnecting the first electronic component and the second electronic component through an external force by a pin inserted through the first opening. In addition, various embodiments may be possible.

13 Claims, 29 Drawing Sheets

(51) Int. Cl.
*H05K 5/02* (2006.01)
*H05K 5/00* (2006.01)

(56) References Cited

U.S. PATENT DOCUMENTS

| | | | | |
|---|---|---|---|---|
| 4,927,787 | A * | 5/1990 | Patel | H01H 27/04 |
| | | | | 200/506 |
| 6,152,777 | A * | 11/2000 | Smith | H01R 13/6456 |
| | | | | 200/506 |
| 6,349,786 | B1 * | 2/2002 | Gift | A63G 25/00 |
| | | | | 180/271 |
| 7,138,589 | B2 * | 11/2006 | Tanaka | H01H 15/102 |
| | | | | 200/43.04 |
| 9,837,765 | B2 * | 12/2017 | Heiskanen | G06K 13/0806 |
| 2006/0278511 | A1 * | 12/2006 | Yang | H01H 27/00 |
| | | | | 200/329 |
| 2013/0227312 | A1 | 8/2013 | Sakai et al. | |
| 2015/0372516 | A1 | 12/2015 | Na et al. | |
| 2016/0006173 | A1 | 1/2016 | Wang et al. | |
| 2016/0380385 | A1 | 12/2016 | Heiskanen | |

FOREIGN PATENT DOCUMENTS

| | | |
|---|---|---|
| KR | 10-2003-0038056 A | 5/2003 |
| KR | 10-2007-0058723 A | 6/2007 |
| KR | 10-2008-0099662 A | 11/2008 |
| KR | 10-2015-0019134 A | 2/2015 |
| KR | 10-1519510 B1 | 5/2015 |
| KR | 10-2016-0003557 A | 1/2016 |
| KR | 10-2016-0053135 A | 5/2016 |
| KR | 10-2016-0064038 A | 6/2016 |

OTHER PUBLICATIONS

Decision on Grant dated Oct. 28, 2021, issued in Korean Application No. 10-2017-0027378.

* cited by examiner

ELECTRONIC DEVICE WITH A SWITCH TO PREVENT OVER-DISCHARGING OF DEVICE BATTERY

CROSS-REFERENCE TO RELATED APPLICATION(S)

This application is a U.S. National Stage application under 35 U.S.C. § 371 of an International Application number PCT/KR2018/002447, filed on Feb. 28, 2018, which is based on and claimed priority of a Korean patent application No. 10-2017-0027378, filed on Mar. 2, 2017, in the Korean Intellectual Property Office, the disclosure of which is incorporated by reference herein in its entirety.

TECHNICAL FIELD

Various embodiments of the present disclosure relate to an apparatus for preventing over-discharge of a battery and an electronic device including the apparatus.

BACKGROUND ART

An electronic device such as a portable terminal, etc., refers to a device that provides an electronic note function such as schedule management, etc., an entertainment function for enjoying multimedia such as music or moving images or a game, and a communication function such as Internet connection, voice communication, etc., and may be used while being carried by a user. Such portable terminals include a built-in or removable battery, thus being provided with power such that the user may use the terminal while carrying the terminal. To make the electronic device elegant in terms of design while improving a waterproof/dustproof effect of the electronic device, an exterior of the electronic device may be formed as one piece and a built-in battery may be used.

DETAILED DESCRIPTION OF THE INVENTION

Technical Problem

When an electronic device including a built-in battery is left for a long time in a power-off state, the built-in battery may be over-discharged. When the built-in battery is over-discharged, swelling of the battery occurs, degrading performance of the built-in battery.

An electronic device according to various embodiments of the present disclosure prevents over-discharge of the battery through blocking an electrical connection between a built-in battery and a circuit board provided with power from the battery, when the battery is not used for a long time.

Technical Solution

An electronic device including an over-discharge preventing apparatus according to various embodiments of the present disclosure includes a housing including a first opening, a first electronic component arranged inside the housing, a second electronic component electrically connected with the first electronic component, and a switch configured to electrically connect the first electronic component with the second electronic component or block an electrical connection between the first electronic component and the second electronic component, by an external force exerted by a pin inserted through the first opening.

An electronic device including an over-discharge preventing apparatus according to various embodiments of the present disclosure may further include a housing including a first face facing a first direction and a second face facing a second direction that is opposite the first direction, the housing further including a first opening formed between the first face and the second face, a battery arranged inside the housing, a circuit board configured to receive power from the battery, and a switch electrically connecting the battery with the circuit board or blocking an electrical connection between the battery and the circuit board, by the external force exerted by the pin inserted through the first opening.

A method for using an electronic device including an over-discharge preventing apparatus according to various embodiments of the present disclosure includes an operation of inserting a pin into a first opening formed in a housing of the electronic device, an operation in which a movable member of a switch arranged between a battery and a circuit board received with power from the battery receives an external force of the pin, an operation in which the movable member is movement-limited by a locking portion, an operation in which the movable member releases a contact between the first terminal and the second terminal, and an operation of blocking an electrical connection between the battery and the circuit board as the contact between the first terminal and the second terminal is released.

Advantageous Effects

An electronic device that prevents over-discharge of a battery according to various embodiments of the present disclosure may selectively block or make an electrical connection between the battery and a circuit board as a switch is pressed by insertion of a pin through a first opening formed in a housing.

The electronic device that prevents over-discharge of the battery according to various embodiments of the present disclosure may improve the waterproof/dustproof effect of the electronic device because of no need for a separate hole by using the first opening formed in the housing.

MODE FOR CARRYING OUT THE INVENTION

Figure 1:
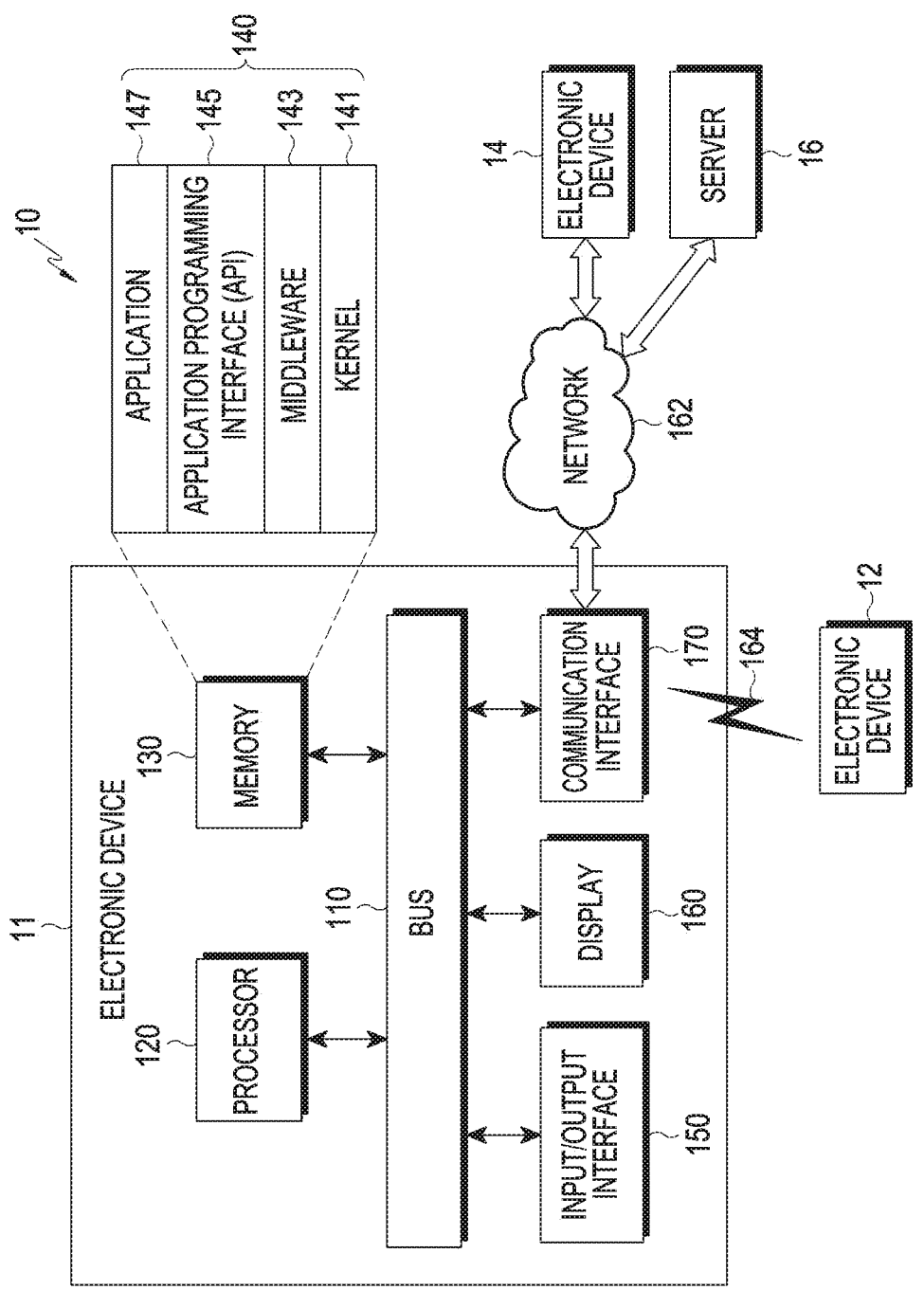
FIG. 1 is a schematic block diagram of an electronic device in a network environment according to one embodiment of the present disclosure.

Hereinafter, various embodiments of the present disclosure will be disclosed with reference to the accompanying drawings. Embodiments and terms used therein are not intended to limit the present disclosure to particular embodiments, and it should be construed as including various modifications, equivalents, and/or alternatives according to the embodiments of the present disclosure. With regard to the description of the drawings, similar reference numerals may be used to refer to similar or related elements. It is to be understood that a singular form of a noun corresponding to an item may include one or more of the things, unless the relevant context clearly indicates otherwise. In the present disclosure, an expression such as "A or B," "at least one of A or/and B," or "one or more of A or B" may include all possible combinations of together listed items. Expressions such as "first," "second," "primarily," or "secondary," used herein may represent various elements regardless of order and/or importance and do not limit corresponding elements. When it is described that an element (such as a first element) is "operatively or communicatively coupled with/to" or "connected" to another element (such as a second element), the element can be directly connected to the other element or can be connected to the other element through another element (e.g., a third element).

In an embodiment, an expression "configured to (or set)" used in the present disclosure may be replaced with, for example, "suitable for," "having the capacity to," "adapted to," "made to," "capable of," or "designed to" according to a situation. Alternatively, in some situation, an expression "apparatus configured to" may mean that the apparatus "can" operate together with another apparatus or component. For example, a phrase "a processor configured (or set) to perform A, B, and C" may be a dedicated processor (e.g., an embedded processor) for performing a corresponding operation or a generic-purpose processor (such as a central processing unit (CPU) or an application processor) that can perform a corresponding operation by executing at least one software program stored at a memory device.

An electronic device according to various embodiments of the present disclosure may include at least one of, for example, a smartphone, a tablet personal computer (PC), a mobile phone, a video phone, an electronic-book (e-book) reader, a desktop PC, a laptop PC, a netbook computer, a workstation, a server, a personal digital assistant (PDA), a portable multimedia player (PMP), an MP3 player, mobile medical equipment, a camera, or a wearable device. Examples of the wearable device may include at least one of an accessory type (e.g., a watch, a ring, a bracelet, an anklet, a necklace, glasses, contact lenses, head-mounted device (HMD), etc.), a fabric or cloth-integrated type (e.g., electronic clothing, etc.), a body-attached type (e.g., a skin pad, a tattoo, etc.), a body implantable circuit, or the like. In some embodiments, the electronic device may include, for example, at least one of a television (TV), a digital video disk (DVD) player, audio equipment, a refrigerator, an air conditioner, a vacuum cleaner, an oven, a microwave oven, a laundry machine, an air cleaner, a set-top box, a home automation control panel, a security control panel, a media box (e.g., Samsung HomeSync™, Apple TV™, or Google TV™), a game console (e.g., Xbox™ or PlayStation™), an electronic dictionary, an electronic key, a camcorder, or an electronic frame.

In other embodiments, the electronic device may include at least one of various medical equipment (e.g., various portable medical measurement devices (a blood glucose meter, a heart rate measuring device, a blood pressure measuring device, a body temperature measuring device, etc.), magnetic resonance angiography (MRA), magnetic resonance imaging (MRI), computed tomography (CT), an imaging device, or an ultrasonic device), a navigation system, a global navigation satellite system (GNSS), an event data recorder (EDR), a flight data recorder (FDR), a vehicle infotainment device, electronic equipment for ships (e.g., a navigation system and gyro compass for ships), avionics, a security device, a vehicle head unit, an industrial or home robot, an automatic teller's machine (ATM), a point of sales (POS), or an Internet of things device (e.g., electric bulbs, various sensors, electricity or gas meters, sprinkler devices, fire alarm devices, thermostats, streetlights, toasters, exercise machines, hot-water tanks, heaters, boilers, and so forth). According to some embodiments, the electronic device may include a part of a furniture, building/structure or a part of a vehicle, an electronic board, an electronic signature receiving device, a projector, and various measuring instruments (e.g., a water, electricity, gas, electric wave measuring device, etc.). According to various embodiments, the electronic device may be flexible or may be a combination of two or more of the above-described various devices. According to an embodiment of the disclosure, the electronic device is not limited to the above-described devices. In an embodiment, the term "user" used in various embodiments of the present disclosure may refer to a person who uses the electronic device or a device using the electronic device (e.g., an artificial intelligence electronic device).

FIG. 1 is a schematic block diagram of an electronic device in a network environment according to various embodiments of the present disclosure.

Referring to FIG. 1, an electronic device 11 in a network environment 10 according to various embodiments of the present disclosure is disclosed. The electronic device 11 may include a bus 110, a processor 120, a memory 130, an input/output (I/O) interface 150, a display 160, and a communication interface 170. According to some embodiments, the electronic device 11 may omit at least one of the foregoing elements or may further include other elements. The bus 110 may include a circuit for connecting, e.g., the elements 110 to 170 and delivering communication (e.g., a control message or data) between the elements 110 to 170. The processor 120 may include one or more of a central processing unit (CPU), an application processor (AP), and a communication processor (CP). The processor 120 may perform operations or data processing for control or communication of, for example, at least one other elements of the electronic device 11.

The memory 130 may include a volatile or nonvolatile memory. The memory 130 may store, for example, instructions or data associated with at least one other elements of the electronic device 11. According to an embodiment, the memory 130 may store software or a program 140. The program 140 may include at least one of, for example, a kernel 141, middleware 143, an application programming interface (API) 145, or an application program (or "application") 147, and the like. At least some of the kernel 141, the middleware 143, and the API 145 may be referred to as an operating system (OS). The kernel 141 may control or manage, for example, system resources (e.g., the bus 110, the processor 120, the memory 130, etc.) used to execute operations or functions implemented in other programs (e.g., the middleware 143, the API 145, or the application program 147). The kernel 141 provides an interface through which the middleware 143, the API 145, or the application program 147 accesses separate components of the electronic device 11 to control or manage the system resources.

The middleware 143 may work as an intermediary for allowing, for example, the API 145 or the application program 147 to exchange data in communication with the kernel 141. In addition, the middleware 143 may process one or more task requests received from the application program 147 based on priorities. For example, the middleware 143 may give a priority for using a system resource (e.g., the bus 110, the processor 120, the memory 130, etc.) of the electronic device 11 to at least one of the application programs 147, and may process the one or more task requests. The API 145 is an interface used for the application 147 to control a function provided by the kernel 141 or the middleware 143, and may include, for example, at least one interface or function (e.g., an instruction) for file control, window control, image processing or character control. The I/O interface 150 may deliver, for example, an instruction or data input from a user or another external device to other component(s) of the electronic device 11, or output an instruction or data received from other component(s) of the electronic device 11 to a user or another external device.

The display 160 may include, for example, a liquid crystal display (LCD), a light emitting diode (LED) display, an organic light emitting diode (OLED) display, a microelectromechanical system (MEMS) display, or an electronic paper display. The display 160 may, for example, display various contents (e.g., a text, an image, a video, an icon, a symbol, etc.) to users. The display 160 may include a touchscreen and receive a touch, a gesture, proximity, or a hovering input, for example, by using an electronic pen or a part of a body of a user. The communication interface 170 establishes communication between the electronic device 11 and an external device (e.g., the vehicle device 12, the electronic device 14, or the server 16). For example, the communication interface 170 may be connected to a network 162 through a wireless communication or wired communication to communicate with an external device (e.g., the second external electronic device 14 or the server 16).

The wireless communication may include cellular communication using at least one of Long Term Evolution (LTE), LTE-Advanced (LTE-A), Code Division Multiple Access (CDMA), Wideband CDMA (WCDMA), a Universal Mobile Telecommunication System (UMTS), Wireless Broadband (WiBro), or Global System for Mobile Communications (GSM). According to an embodiment, the wireless communication may include at least one of Wireless Fidelity (WiFi), Light Fidelity (LiFi), Bluetooth, Bluetooth Low Energy (BLE), Zigbee, near field communication (NFC), magnetic secure transmission (MST), radio frequency (RF), and a body area network (BAN), as illustrated as an element 164 in FIG. 1. According to an embodiment, the wireless communication may include a global navigation satellite system (GNSS). The GNSS may include, for example, at least one of a global positioning system (GPS), a global navigation satellite system (Glonass), a Beidou navigation satellite system ("Beidou"), or Galileo, the European global satellite-based navigation system. In an embodiment, "GPS" may be used interchangeably with "GNSS." The wired communication may include, for example, at least one of a universal serial bus (USB), a high definition multimedia interface (HDMI), Recommended Standard 232 (RS-232), power line communication, a plain old telephone service (POTS), or the like. The network 162 may include a telecommunications network, for example, at least one of a computer network (e.g., a local area network (LAN) or a wide area network (WAN)), the Internet, and a telephone network.

Each of the first external electronic device 12 and the second external electronic device 14 may be a device of the same type as or a different type than the electronic device 11. According to various embodiments of the present disclosure, some or all of operations performed by the electronic device 11 may be performed in another electronic device or a plurality of electronic devices (e.g., the electronic device 12, 14 or the server 16). According to an embodiment of the present disclosure, when the electronic device 11 has to perform a function or a service automatically or at a request, the electronic device 11 may request another device (e.g., the electronic devices 12 or 14 or the server 16) to perform at least some functions associated with the function or the service instead of or in addition to executing the function or the service. The another electronic device (e.g., the electronic device 12 or 14 or the server 16) may execute the requested function or additional function and deliver the execution result to the electronic device 11. The electronic device 11 may then process or further process the received result to provide the requested function or service. To that end, a cloud computing, distributed computing, or client-server computing technology may be used, for example.

Figure 2:
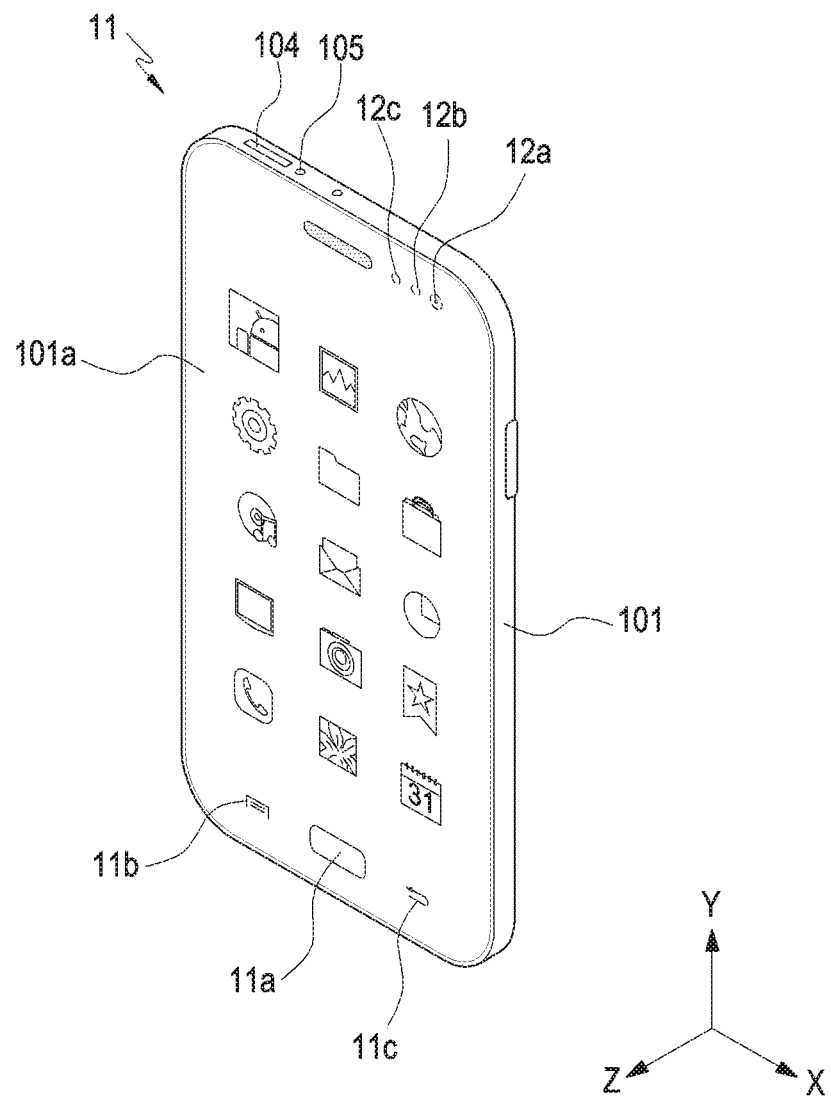
FIG. 2 is a front perspective view illustrating an electronic device according to one embodiment of the present disclosure.
Figure 3:
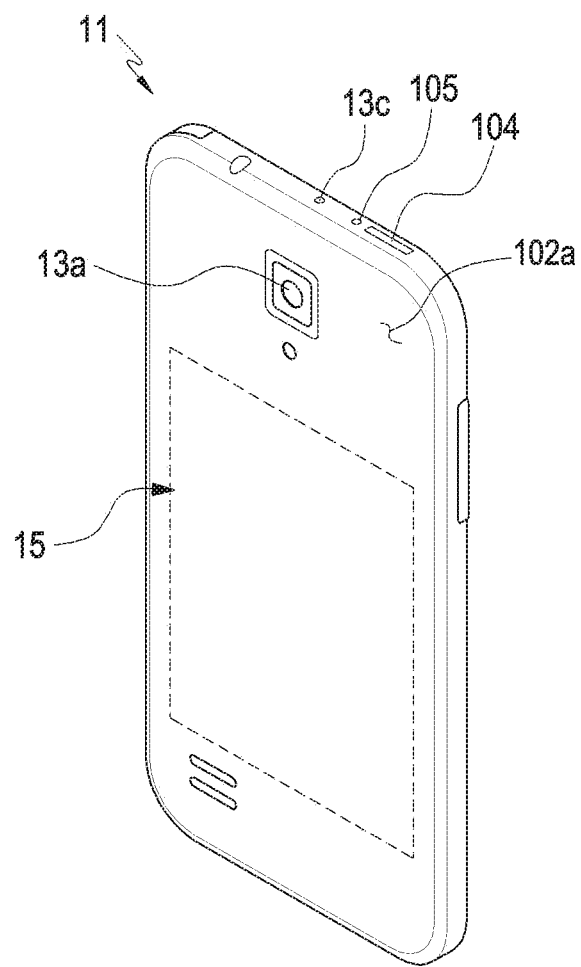
FIG. 3 is a rear perspective view of an electronic device according to one embodiment of the present disclosure.

FIG. 2 is a front perspective view of an electronic device including a display device according to various embodiments of the present disclosure. FIG. 3 is a rear view of an electronic device including a display device according to various embodiments of the present disclosure.

In FIG. 2, in a three-axis orthogonal coordinate system, 'X' may denote the width direction of the electronic device 11, 'Y' may denote the length direction of the electronic device 11, and 'Z' may denote the thickness direction of the electronic device 11.

As illustrated in FIGS. 2 and 3, the electronic device 11 may include a housing 101 and a display device 200. The housing 101 may include a first face 101a facing a first (+Z) direction and a second face 102a facing a second (−Z) direction that is opposite the first (+Z) direction. The front face of the housing 101 may be opened, and a transparent cover may be mounted to form at least a portion of the first face 101a to close the opened first face 101a of the housing 101. In another example, when viewed from top of the first face 101a, the transparent cover may be arranged on the entire front surface of the electronic device 11.

According to an embodiment of the present disclosure, a keypad including mechanically operating buttons or touch keys 11a, 11b, are 11c may be provided on one side region of a front face (e.g., the first face 101a) of the housing 101. The touch key may generate an input signal by a user's body contact. According to various embodiments, the keypad may be implemented with only mechanical buttons or with only touch keys. Various types of circuit devices, such as the processor 120, the memory 130, the input/output (I/O) interface 150, and the communication interface 170 described above may be accommodated in the housing 101, and a battery 15 may be accommodated in the housing 101 to secure a power source.

According to an embodiment of the present disclosure, a first camera 12a, an illumination sensor 12b, or a proximity sensor 12c may be arranged on an upper region of the front face of the electronic device 11. In another example, a second camera 13a, a flash, or a speaker 13c may be arranged on the rear face of the electronic device 11.

Figure 4:
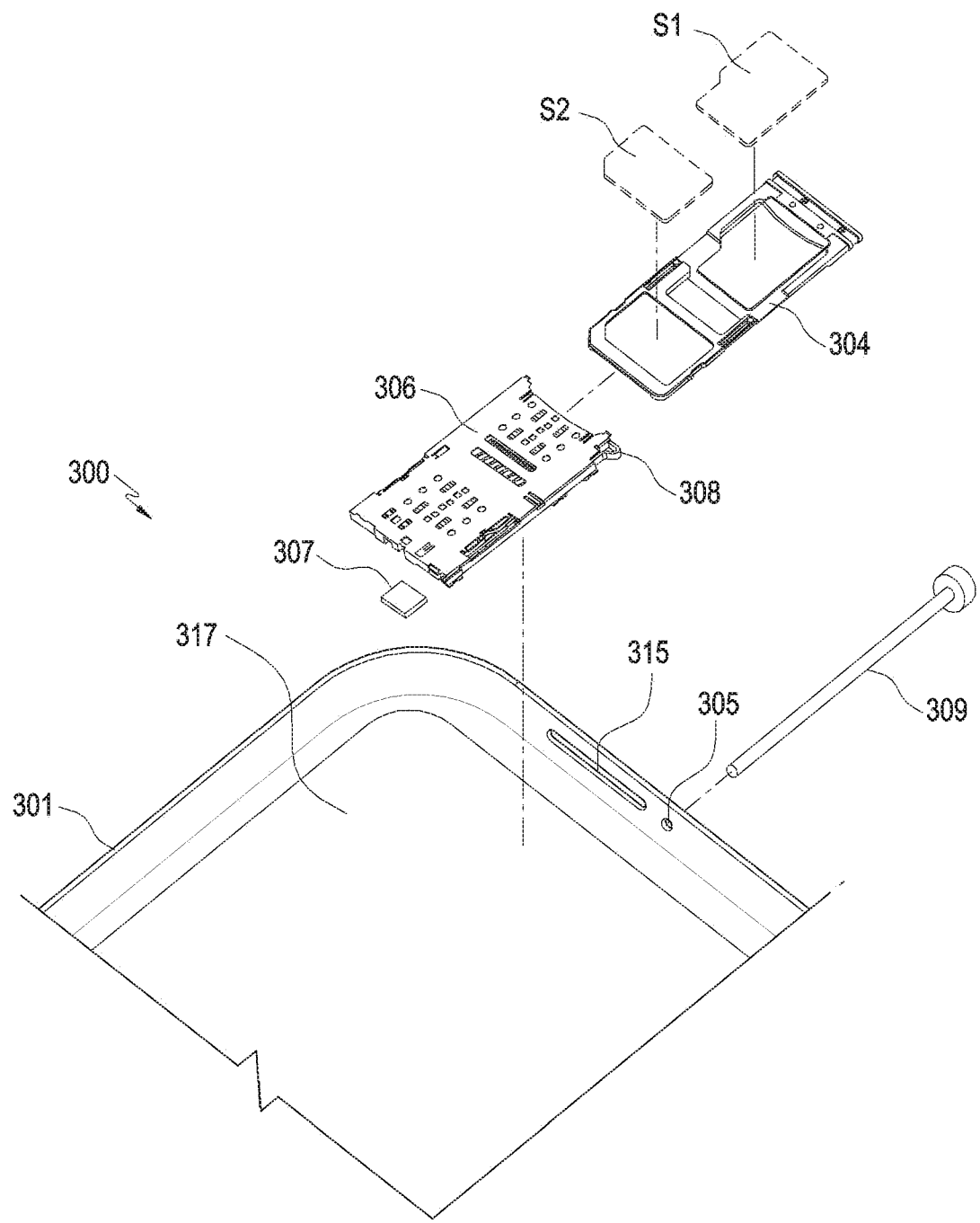
FIG. 4 is an exploded perspective view illustrating an electronic device according to one embodiment of the present disclosure.
Figure 5:
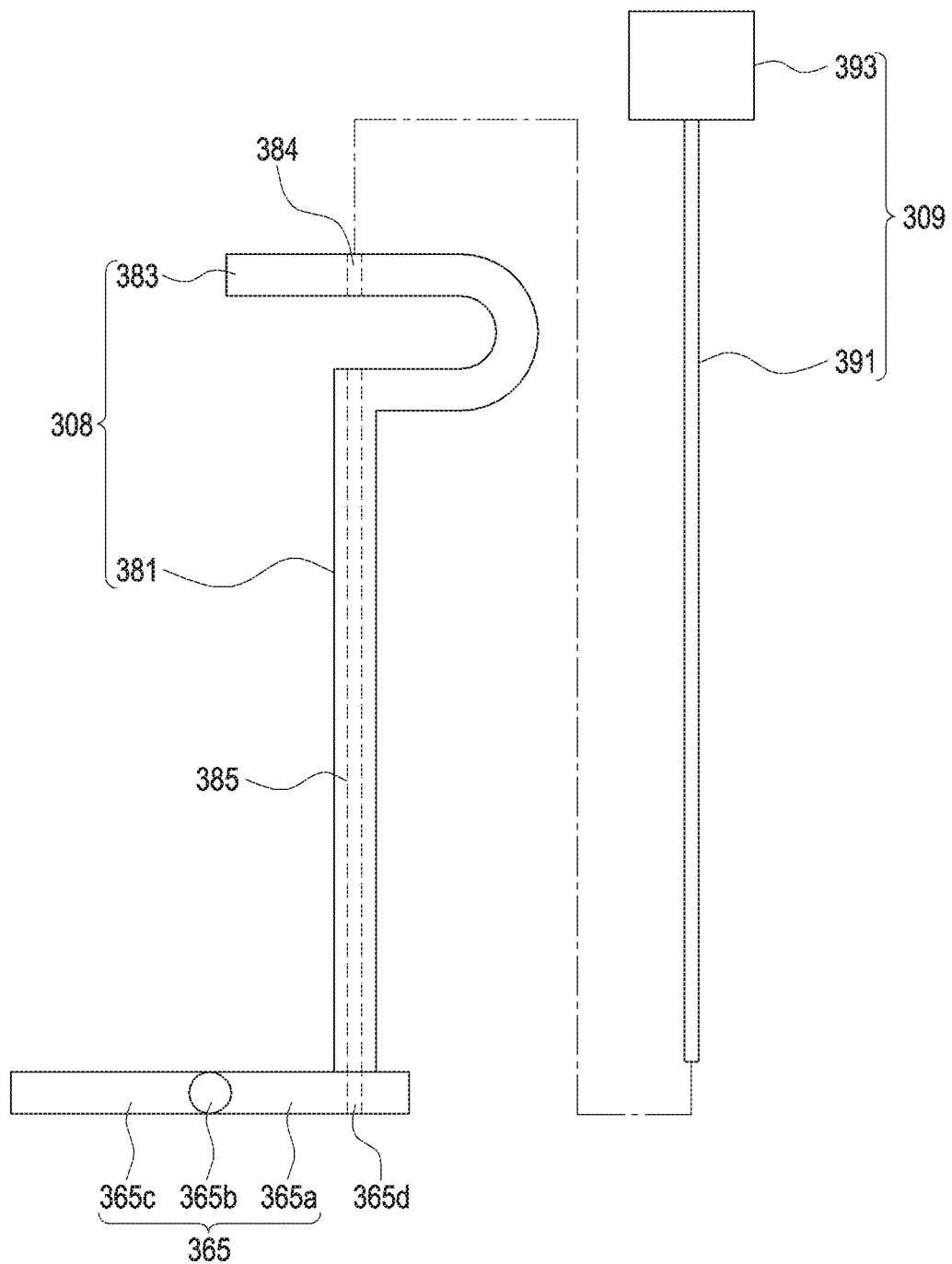
FIG. 5 is a plane view illustrating a push bar, a lever, and a pin of an electronic device according to one embodiment of the present disclosure.
Figure 6:
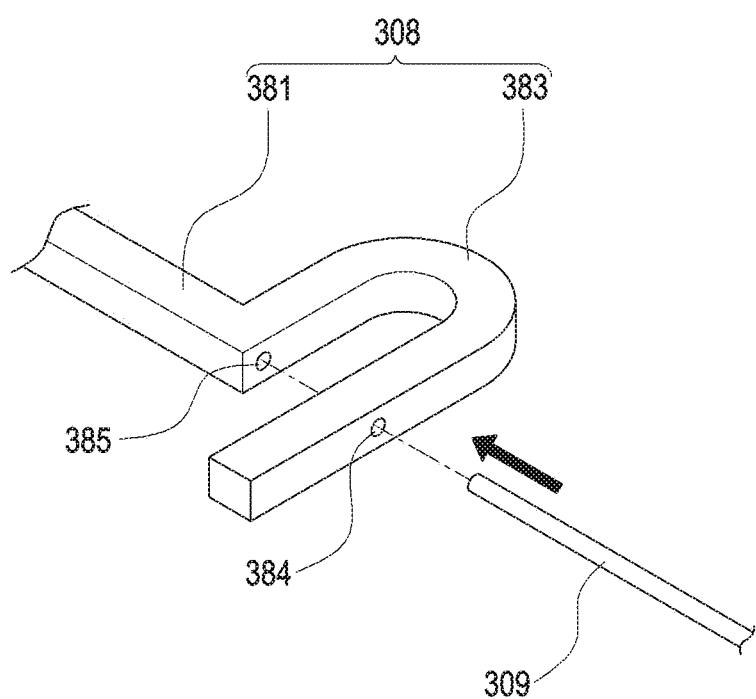
FIG. 6 is a perspective view illustrating a push bar, a lever, and a pin of an electronic device according to one embodiment of the present disclosure.

FIG. 4 is an exploded perspective view illustrating an electronic device (e.g., the electronic device 11 of FIG. 3) according to one of various embodiments of the present disclosure. FIG. 5 is a plane view illustrating a push bar, a lever, and a pin of an electronic device (e.g., the electronic device 11 of FIG. 3) according to one of various embodiments of the present disclosure. FIG. 6 is a perspective view illustrating a push bar and a pin of an electronic device (e.g., the electronic device 11 of FIG. 3) according to one of various embodiments of the present disclosure.

Referring to FIGS. 4 through 6, an electronic device 300 (e.g., the electronic device 11 of FIG. 3) according to one of various embodiments of the present disclosure may include a housing 301, a first electronic component (e.g., the battery 15 of FIG. 3), a second electronic component 317, a socket 306, a tray 304, a push bar 308, a lever (e.g., a lever 365 of FIG. 5), and a switch 307.

In an upper face of the housing 301 may be formed a second opening 315 through which the tray 304 is inserted or drawn. In the upper face of the housing 301 may be formed a first opening 305 that is arranged adjacent to the second opening 315 and is smaller in size than the second opening 315. The first opening 305 may be a hole manipulated to draw the tray 304 through the second opening 315.

According to an embodiment of the present disclosure, the first electronic component may include the battery (15 of FIG. 3). The second electronic component 317 may include a circuit board. The circuit board 317 may be mounted on an inner side of the housing 301.

According to an embodiment of the present disclosure, the socket 306 may be connected with the circuit board 317. The tray 304 may be inserted into the socket 306 such that the socket 306 may be coupled with the tray 304 in an attachable/detachable manner. For example, the tray 304 may be inserted into or drawn out of the socket 306.

According to an embodiment of the present disclosure, the tray 304 may be inserted into the socket 306 and locked, while receiving storage media S1 and S2 therein. The storage media S1 and S2 may include a subscriber identification module (SIM) card or a memory card. The memory card may include a secure-digital (SD) card or a micro SD card.

According to an embodiment of the present disclosure, the push bar 308 may be arranged inside the socket 306 along a longitudinal direction of the socket 306. According to an embodiment of the present disclosure, the push bar 308 may be arranged outside the socket 306.

The push bar 308 may include a push bar head 383 and a push bar body 381. According to an embodiment of the present disclosure, the push bar head 383 may have a bent form. The push bar head 383 may include a first push bar hole 384 connected with a first opening 305 formed in the housing 301. The push bar body 381 may extend from the push bar head 383 to have a longitudinal direction. The push bar body 381 may include a second push bar hole 385 connected with the first push bar hole 384.

According to an embodiment of the present disclosure, the lever 365 may be coupled with the push bar 308 and may rotate with movement of the push bar 308. The lever 365 may include a first lever 365a, a rotation shaft 365b, and a second lever 365c. The first lever 365a may be coupled with the push bar 308. The second lever 365c may be connected with the first lever 365a. The first lever 365a and the second lever 365c may rotate with respect to the rotation shaft 365b. Along with rotation of the lever 365, an end of the tray 304 mounted in the socket 306 is pushed, such that the tray 304 may be ejected to outside the housing 301. The lever 365 may include a lever hole 365d connected with the second push bar hole 385.

The switch 307 may be arranged adjacent to a lower portion of the socket 306. The switch 307 will be described in detail later.

The electronic device 300 according to one of various embodiments of the present disclosure may further include a pin 309. The pin 309 may be inserted into the inside of the housing 301 through the first opening 305. The pin 309 may include a pin body 391 and a grip 393. The pin body 391 may have a length longer than that of the push bar 308. The grip 393 may extend from the pin body 391 and may be gripped by a user. The pin 309 may be inserted into the first push bar hole 384 and the second push bar hole 385 through the first opening 305. The pin 309 may press the switch 307 by passing through the second push bar hole 309.

Figure 7:
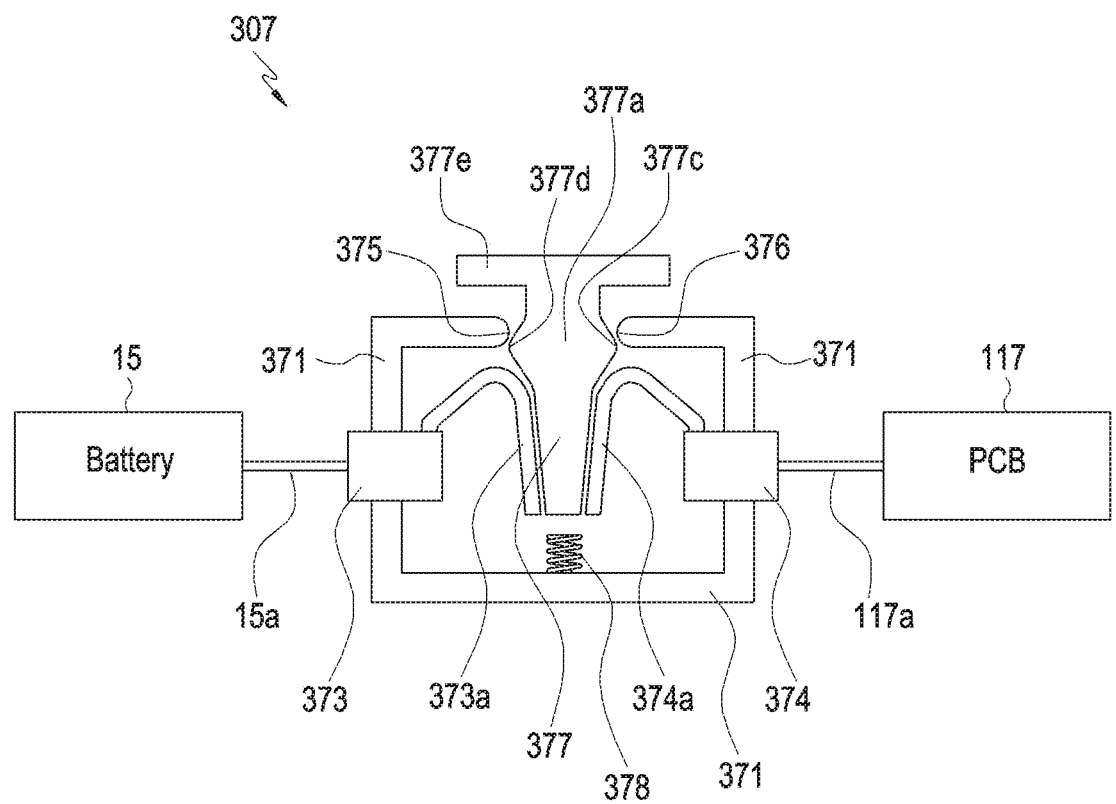
FIG. 7 is a cross-sectional view illustrating a switch of an electronic device according to one embodiment of the present disclosure.

FIG. 7 is a cross-sectional view illustrating a switch (e.g., the switch 307 of FIG. 4) of an electronic device according to one of various embodiments of the present disclosure.

Referring to FIG. 7, the switch 307 (e.g., the switch 307 of FIG. 4) according to one of various embodiments of the present disclosure may include a case 371, a first pad 373, a first terminal 373a, a second pad 374, a second terminal 374a, a movable member 377, an elastic member 378, and locking portions 375, 376, 377c, and 377d.

The case 371 may be arranged inside a housing (301 of FIG. 4). A case hole may be formed on a face of the case 371.

According to an embodiment of the present disclosure, the first pad 373 may be arranged on a face of the case 371. The first pad 373 may be electrically connected with the battery 15 through a first conducting wire 15a.

According to an embodiment of the present disclosure, the first terminal 373a may be connected with the first pad 373, while being included inside the case 371. The first terminal 373a may be electrically connected with the battery 15 through the first conducting wire 15a and the first pad 373.

According to an embodiment of the present disclosure, the second pad 374 may be arranged on a second face of the case 371. The second pad 374 may be electrically connected with a circuit board 117 through a second conducting wire 117a.

According to an embodiment of the present disclosure, the second terminal 374a may be connected with the second pad 374, while being included inside the case 371. The second terminal 374a may be electrically connected with the circuit board 117 through the second conducting wire 117a and the second pad 374. When a contact of the first terminal 373a with the second terminal 374a is released, an electrical connection between the battery 15 and the circuit board 117 may be blocked.

According to an embodiment of the present disclosure, the movable member 377 may reciprocate inside the case 371. A portion 377e of the movable member 377 may be exposed to outside through the case hole. The portion 377e of the movable member 377 may contact the pin (309 of FIG. 21). The movable member 377 may include a body 377a having a longitudinal direction. The portion 377e of the movable member 377 may extend from the body 377a and may be exposed to the outside of the case 377.

According to an embodiment of the present disclosure, the elastic member 378 may be arranged to face a face of the movable member 377. The elastic member 378 may have a spring form. According to various embodiments of the present disclosure, the elastic member 378 is not limited to the spring form and may have various structures having an elastic force.

According to an embodiment of the present disclosure, the locking portion may include first locking portions 375 and 376 and second locking portions 377c and 377d. The first locking portions 375 and 376 may be formed along the case hole. A cross section of the first locking portions 375 and 376 may have a round form. The second locking portions 377c and 377d may be formed to protrude along an outer circumferential surface of the body 377a of the movable member 377.

Figure 8:
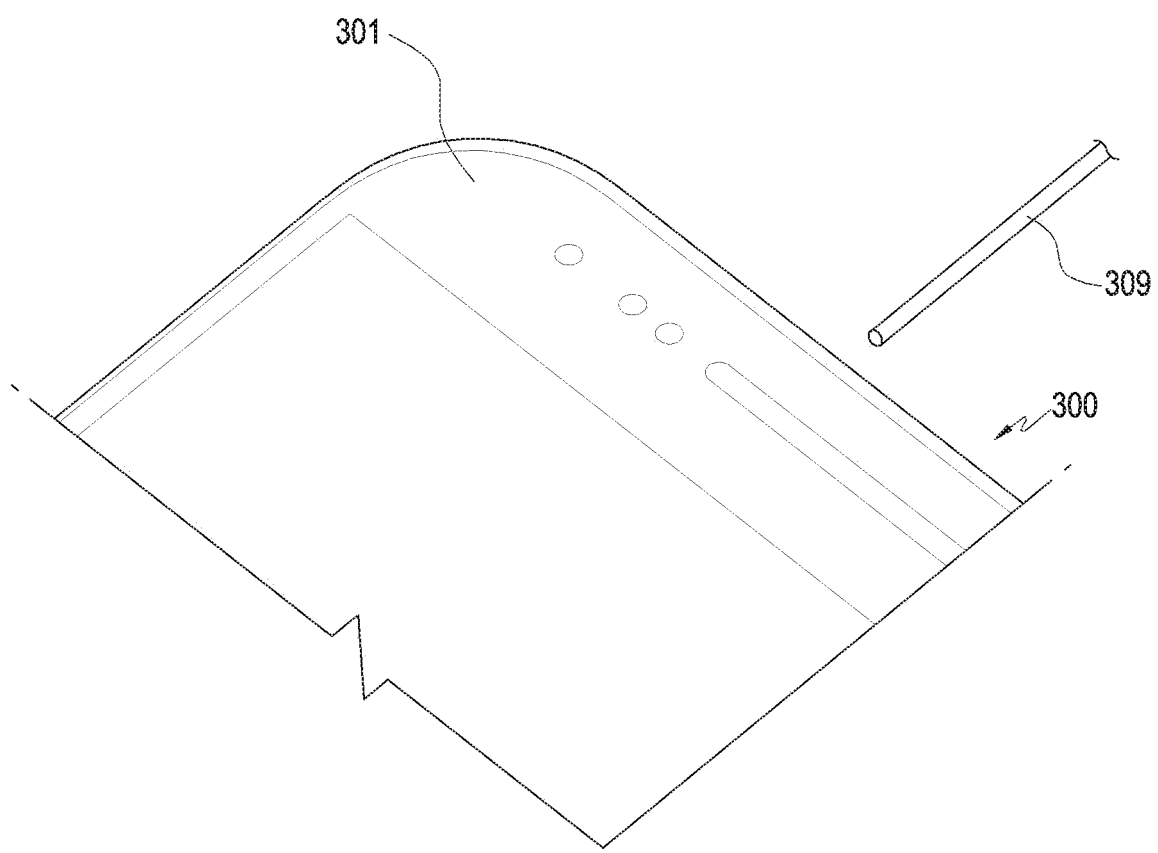
FIG. 8 is a perspective view showing a state before a pin is inserted through a first opening of an electronic device, according to one embodiment of the present disclosure.
Figure 9:
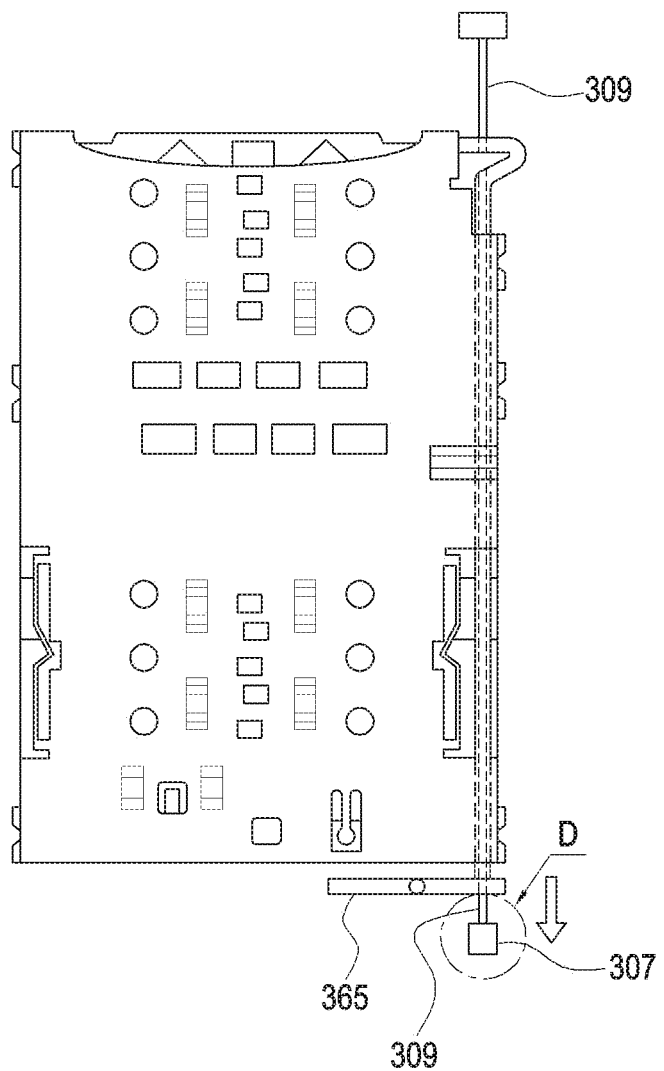
FIG. 9 is a plane view showing a state where a pin is inserted through a first opening of an electronic device and presses a switch, according to one embodiment of the present disclosure.

FIG. 8 is a perspective view showing a state before the pin 309 is inserted through a first opening (e.g., the first opening 305 of FIG. 4) of an electronic device, according to one of various embodiments of the present disclosure. FIG. 9 is a plane view showing a state where a pin is inserted through a first opening of an electronic device and presses a switch, according to one of various embodiments of the present disclosure.

Referring to FIGS. 8 and 9, the pin 309 may be inserted through the first opening (e.g., the first opening 305 of FIG. 4). The pin 309 may be inserted into the first push bar hole 384 after passing through the first opening (e.g., the first opening 305 of FIG. 4). The pin 309 may be inserted into the second push bar hole 385 after passing through the first push bar hole 384. The pin 309 may be inserted into the lever hole 365d after passing through the second push bar hole 385. The pin 309 may press the switch 307 after passing through the lever hole 365d. The operation of the switch 307 will be described later with reference to the drawings.

Figure 10:
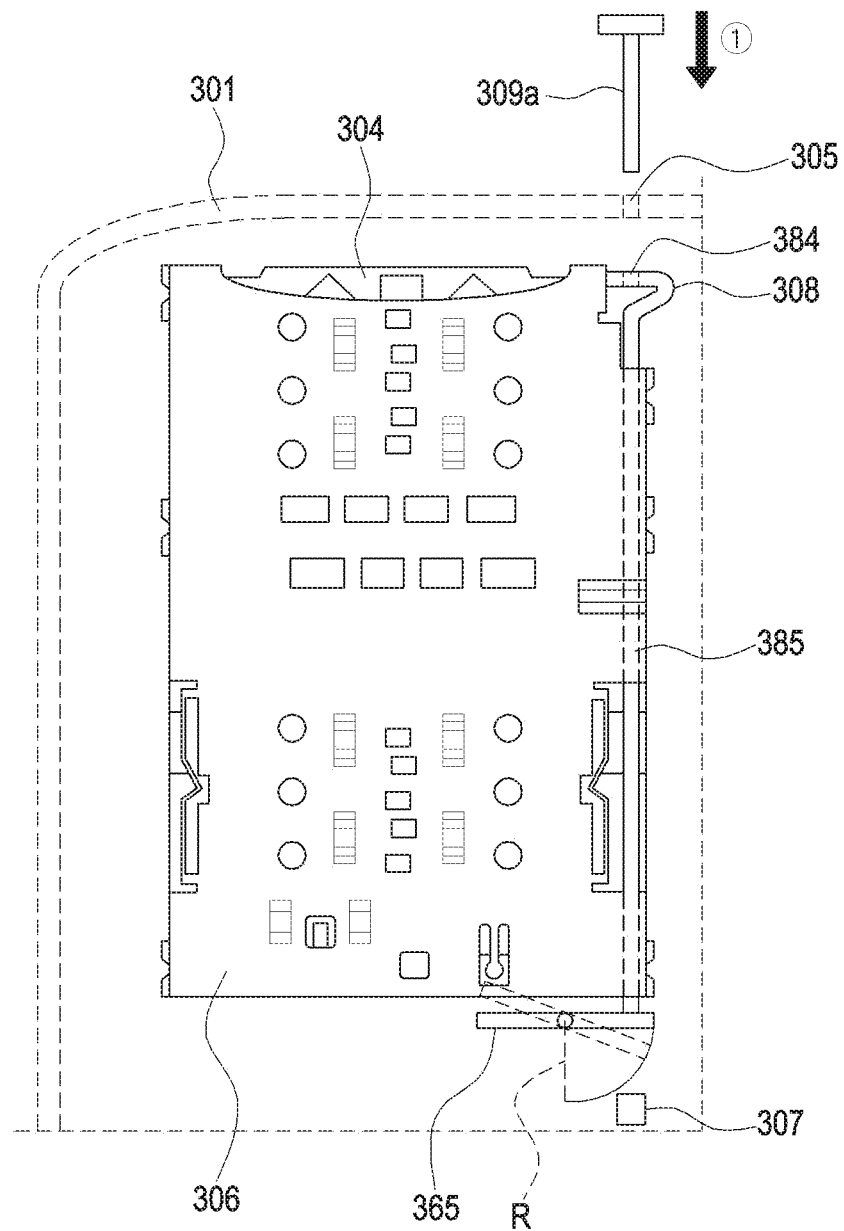
FIG. 10 is a view showing a state before a second pin for ejecting a tray of an electronic device is inserted, according to one embodiment of the present disclosure.
Figure 11:
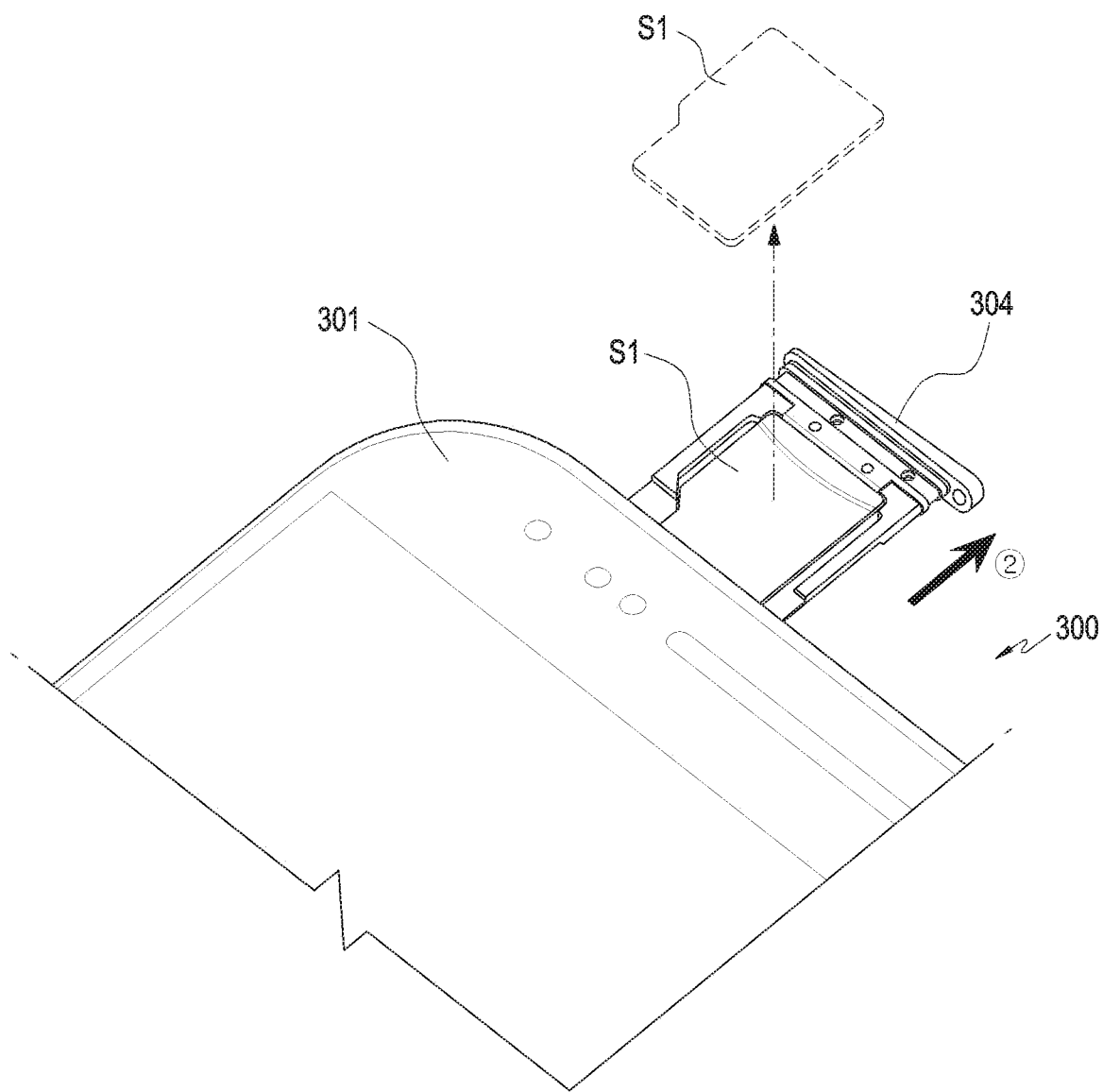
FIG. 11 is a view showing a state where a tray of an electronic device is ejected, according to one embodiment of the present disclosure.

FIG. 10 is a view showing a state before a second pin 309a for ejecting a tray (e.g., the tray 304 of FIG. 4) of an electronic device is inserted, according to one of various embodiments of the present disclosure. FIG. 11 is a view showing a state where a tray of an electronic device is ejected, according to one of various embodiments of the present disclosure.

Referring to FIGS. 10 and 11, a description will be made of a process in which the tray 304 of the electronic device is drawn out, according to various embodiments of the present disclosure.

Referring to FIG. 10, the second pin 309a may be inserted into the first opening 305. An outer diameter of the second pin 309a may be greater than that of the pin 309. For example, the outer diameter of the second pin 309a may be greater than an inner diameter of the first push bar hole 384 such that the second pin 309a may not be inserted into the first push bar hole 384. The second pin 309a may press the push bar 384 through the first opening 305. The push bar 308 may rotate the lever 365 while moving along a first direction ①.

According to an embodiment of the present disclosure, the lever 365 may rotate along a turning radius R. The switch 307 may be arranged in a position that does not overlap the turning radius of the lever 365.

Referring to FIG. 11, the lever 365 may draw the tray 304 out in a second direction ②. The user may separate a SIM card S1 received in the tray 304, when the tray 304 is drawn out of the housing 301.

Figure 12:
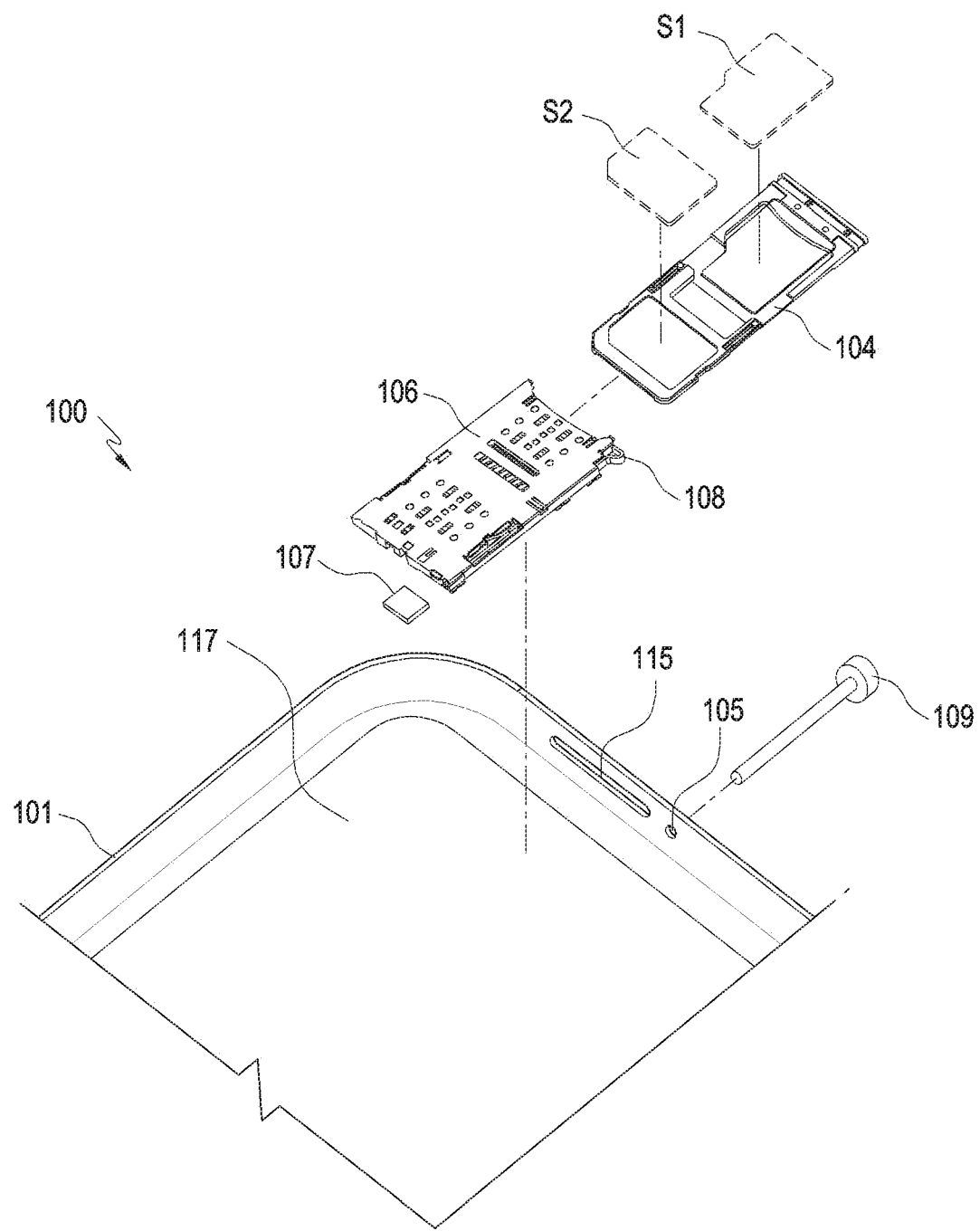
FIG. 12 is an exploded perspective view of an inside of an electronic device according to one embodiment of the present disclosure.
Figure 13:
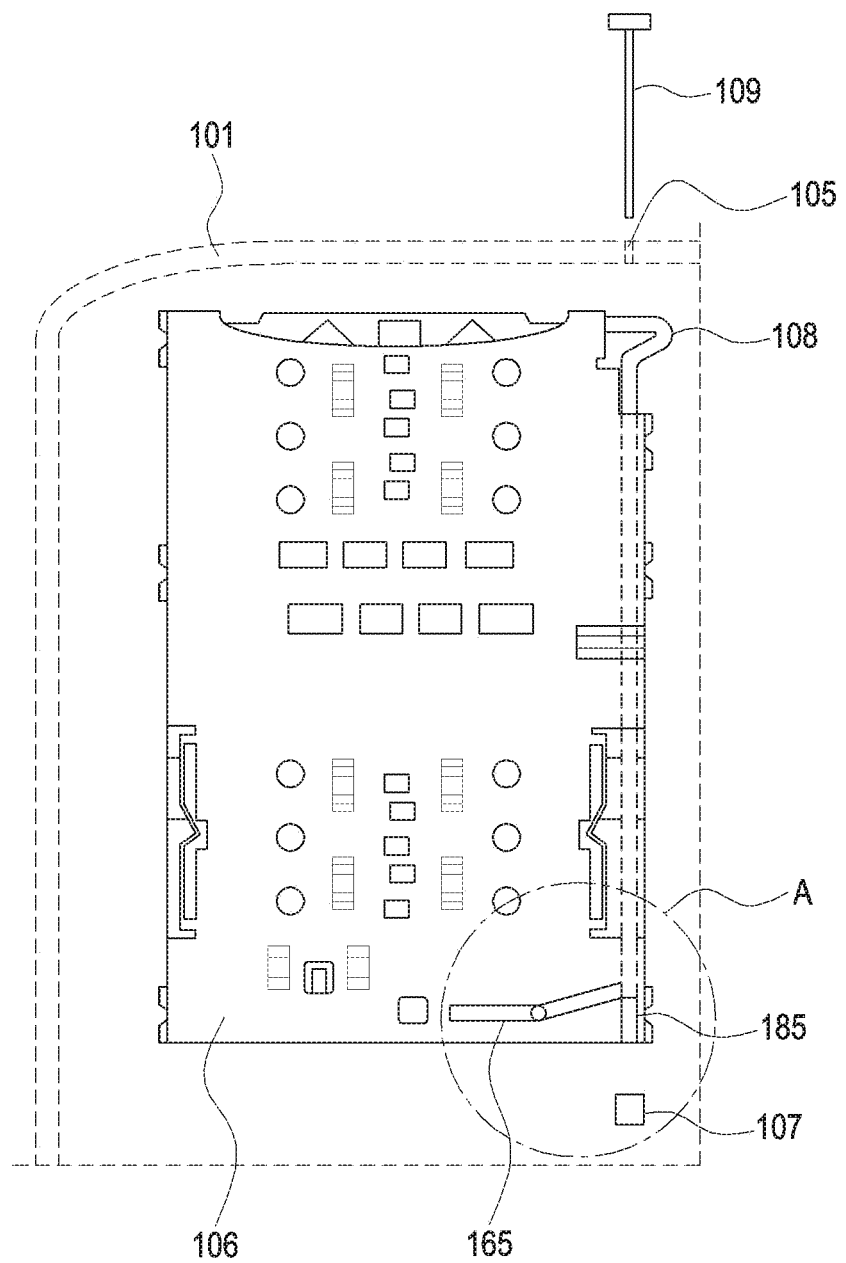
FIG. 13 is a plane view of an inside of an electronic device according to embodiment of the present disclosure.
Figure 14:
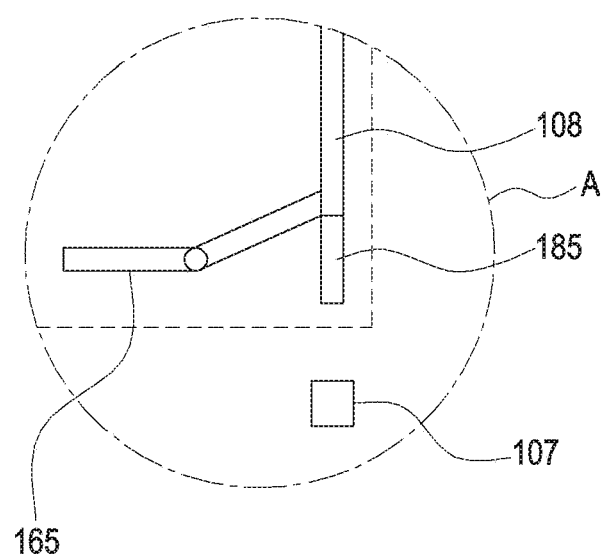
FIG. 14 is an enlarged view of a portion A of FIG. 13.

FIG. 12 is an exploded perspective view illustrating an electronic device (e.g., the electronic device 11 of FIG. 2) according to another one of various embodiments of the present disclosure. FIG. 13 is a plane view of an inside of an electronic device according to another one of various embodiments of the present disclosure. FIG. 14 is an enlarged view of a portion A of FIG. 13.

Referring to FIGS. 12 through 14, an electronic device 100 according to one of various embodiments of the present disclosure may include a housing 101, a circuit board 117, a socket 106, a tray 104, a push bar 108, a lever 165, and a switch 107.

According to an embodiment of the present disclosure, in an upper face of the housing 101 may be formed a second opening 115 through which the tray 104 is inserted or drawn. In the upper face of the housing 101 may be formed a first opening 105 that is arranged adjacent to the second opening 115 and is smaller in size than the second opening 115. The first opening 105 may be a hole manipulated to draw the tray 104 out through the second opening 115.

According to an embodiment of the present disclosure, the circuit board 117 may be mounted on an inner side of the housing 101.

According to an embodiment of the present disclosure, the socket 106 may be connected with the circuit board 117. The tray 104 may be inserted into the socket 106 such that the socket 306 may be coupled with the tray 104 in an attachable/detachable manner. For example, the tray 104 may be inserted into or drawn out of the socket 106.

According to an embodiment of the present disclosure, the tray 104 may be inserted into the socket 106 and locked, while receiving storage media S1 and S2 therein. The storage media S1 and S2 may include a SIM card or a memory card. The memory card may include an SD card or a micro SD card.

According to an embodiment of the present disclosure, the push bar 108 may be arranged inside the socket 106 along a longitudinal direction of the socket 106. The push bar 108 may include an extending portion 185 extending along a longitudinal direction of the push bar 108. A face of the extending portion 185 may press the switch 107 in contact with the switch 107. According to an embodiment of the present disclosure, the push bar 108 may be arranged outside the socket 106.

According to an embodiment of the present disclosure, the lever 165 may be coupled with the push bar 108. For example, the lever 165 may be coupled with an outer face of the push bar 108 by using an adhesive. According to various embodiments of the present disclosure, the lever 165 may be coupled with the push bar 108 in various ways such as bolt-coupling, as well as the adhesive. The lever 165 may rotate together with movement of the push bar 108. Along with rotation of the lever 165, an end of the tray 104 mounted in the socket 106 is pushed, such that the tray 104 may be ejected to outside the housing 101.

According to an embodiment of the present disclosure, the switch 107 may be arranged adjacent to a lower portion of the socket 106. The switch 107 may be pressed by an end of the push bar 108. The switch 107 will be described in detail later.

The electronic device 100 according to one of various embodiments of the present disclosure may further include a pin 109. The pin 109 may be inserted into the inside of the housing 101 through the first opening 105. The pin 109 may cause the push bar 108 to move along the longitudinal direction by pressing the push bar 108.

Figure 15:
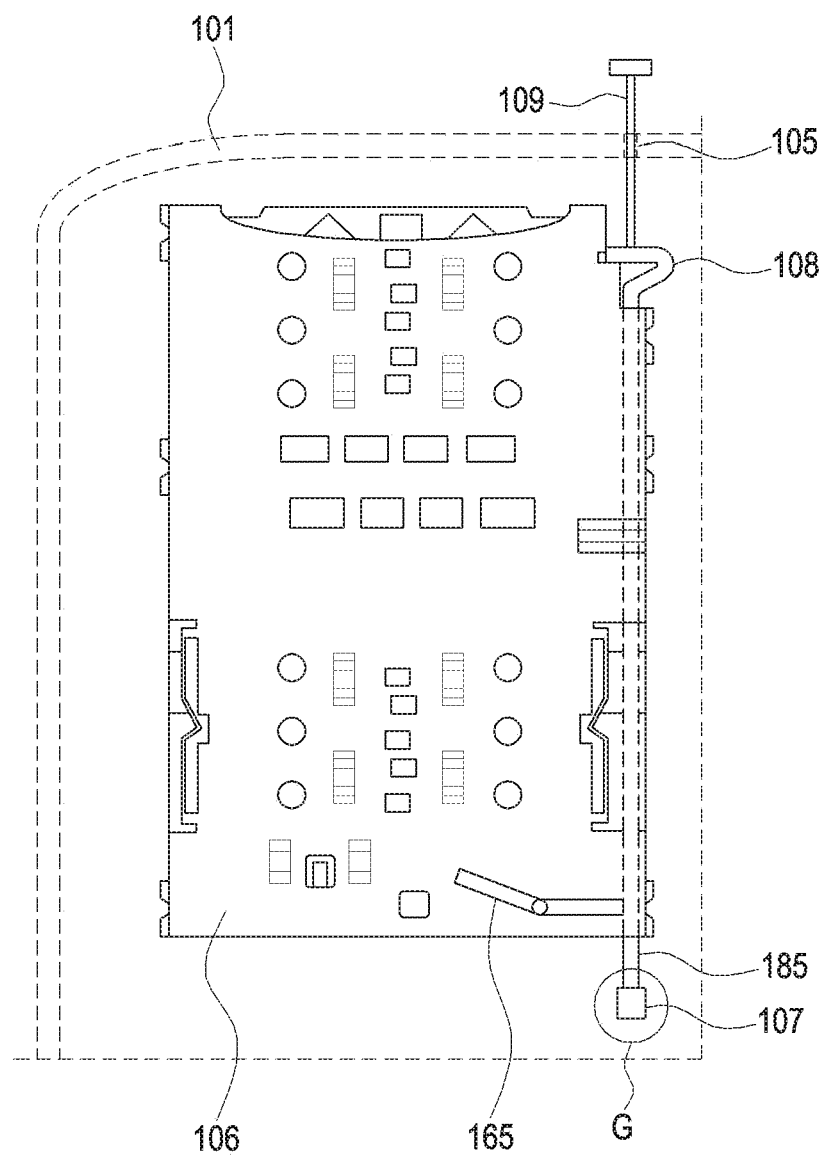
FIG. 15 is a plane view showing a state where a push bar of an electronic device is pressed by a pin, according to one embodiment of the present disclosure.

FIG. 15 is a plane view showing a state where the push bar 108 of the electronic device is pressed by the pin 109, according to another one of various embodiments of the present disclosure.

Referring to FIG. 15, once the pin 109 is inserted into the first opening 105, the pin 109 may press the push bar 108. The push bar 108 may move along the longitudinal direction by an external force of the pin 109. The extending portion 185 of the push bar 108 may press the switch 107. The operation of the switch 107 will be described later with reference to the drawings.

Figure 16:
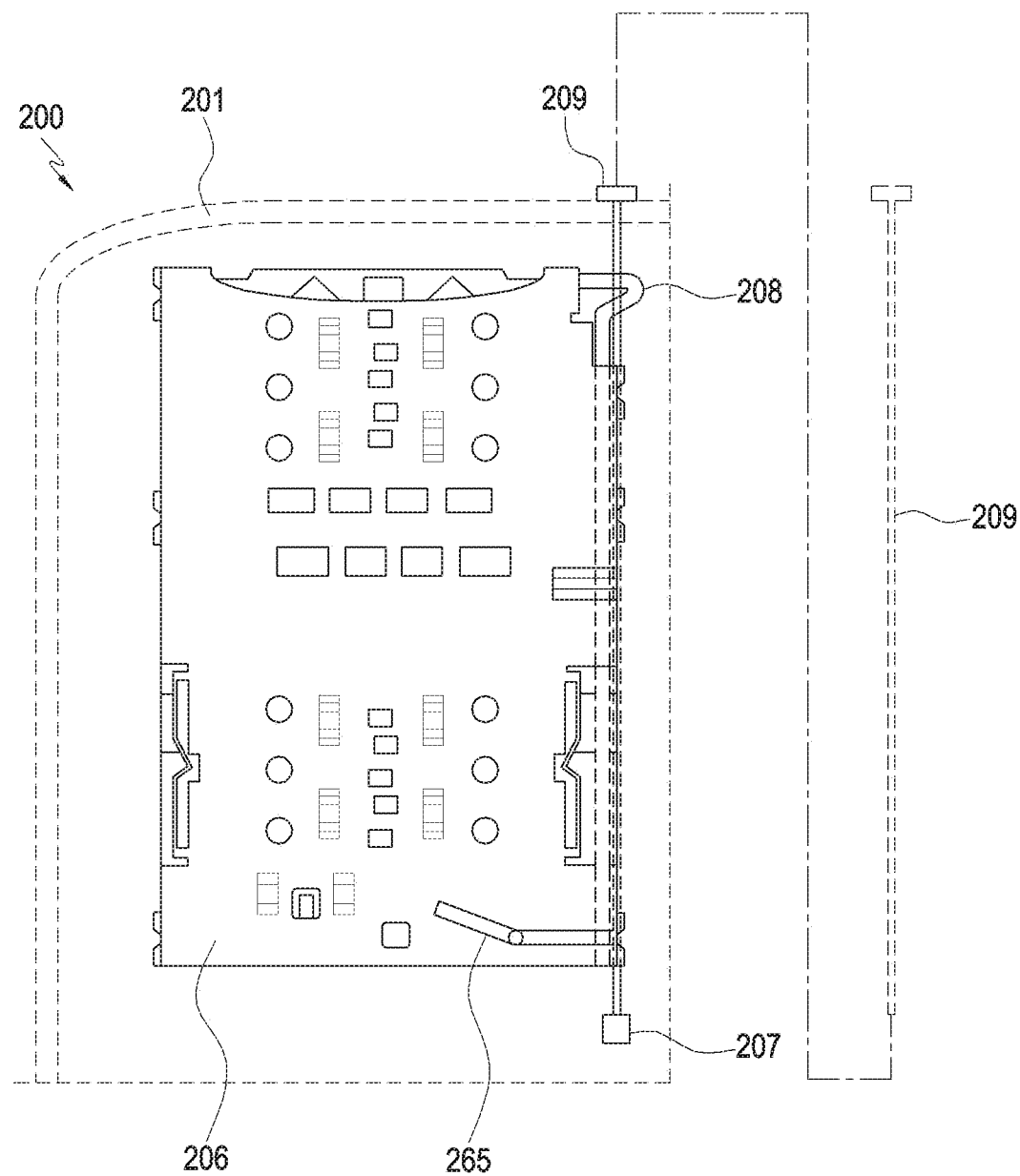
FIG. 16 is a plane view showing a state where a pin is inserted through a first opening of an electronic device, according to one embodiment of the present disclosure.

FIG. 16 is a plane view showing a state where a pin is inserted into a first opening (e.g., the first opening 105 of FIG. 13) of an electronic device, according to yet another one of various embodiments of the present disclosure.

Referring to FIG. 16, an electronic device 200 according to another one of various embodiments of the present disclosure may include a housing 201, a socket 206, a push bar 208, a lever 265, a switch 207, and a pin 209.

According to an embodiment of the present disclosure, the push bar 208 may include push bar holes (not illustrated). The push bar holes (not illustrated) may be connected with the first opening (e.g., the first opening 105 of FIG. 13).

According to an embodiment of the present disclosure, the pin 209 may have a length longer than that of the push bar 208. The pin 209 may be inserted into the first opening (e.g., the first opening 105 of FIG. 13) and the push bar holes (not illustrated). The pin 209 may be inserted into the inside of the housing 201 in parallel with the push bar 208 via the first opening (e.g., the first opening 105 of FIG. 13) and the push bar holes (not illustrated). As being inserted into the inside of the housing 201, the pin 209 may press the switch 207. As the pin 209 presses the switch 207 when the switch 207 electrically connects the battery with the circuit board, an electrical connection between the battery and the circuit board may be blocked. As the pin 209 presses the switch 207 when the switch 207 blocks the electrical connection between the battery and the circuit board, the battery and the circuit board may be electrically connected with each other.

Figure 17:
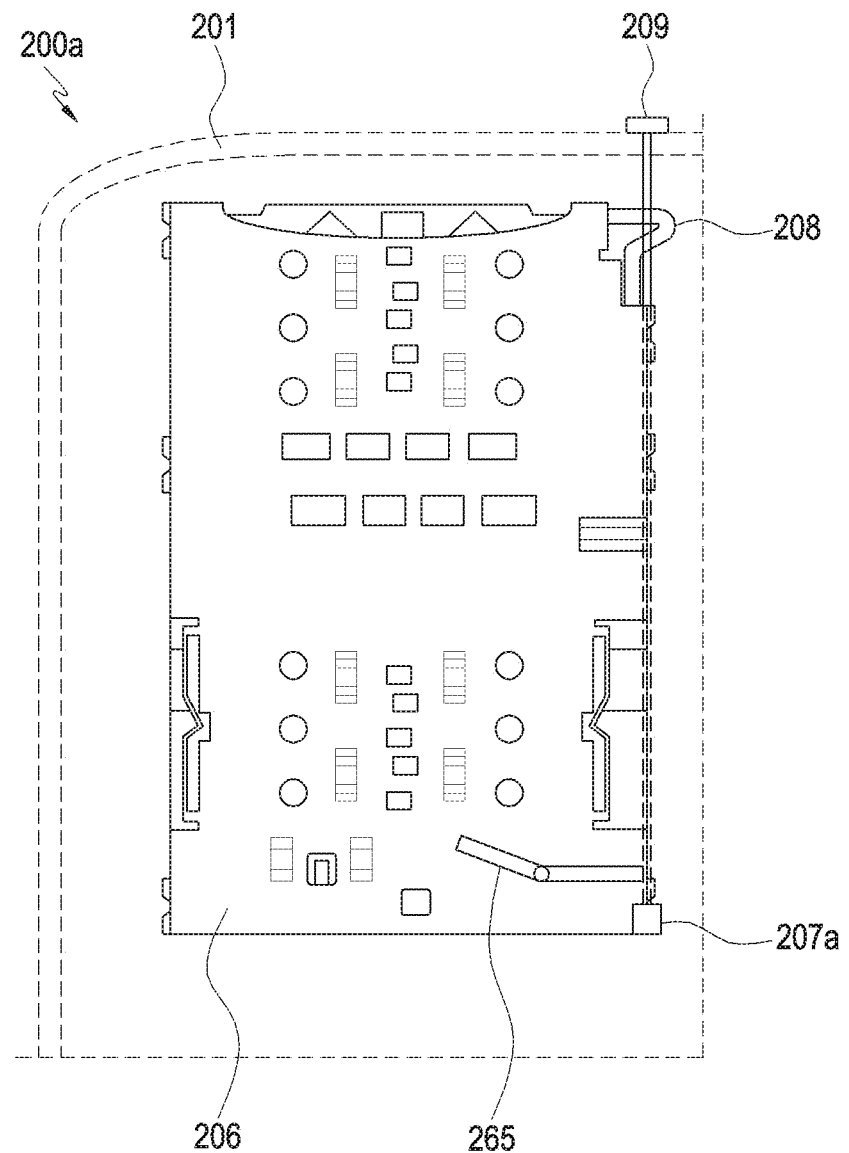
FIG. 17 is a plane view of an inside of an electronic device according to one embodiment of the present disclosure.

FIG. 17 is a plane view of an inside of an electronic device 200a according to yet another one of various embodiments of the present disclosure.

Referring to FIG. 17, the electronic device 200a according to another one of various embodiments of the present disclosure may include a housing 201, a socket 206, a push bar 208, a lever 265, a switch 207a, and a pin 209. The switch 207a may be arranged in the socket 206. As the switch 207a is arranged in the socket 206, a space occupied by the switch 207a may be reduced, contributing to miniaturization of the electronic device 200a.

Figure 18:
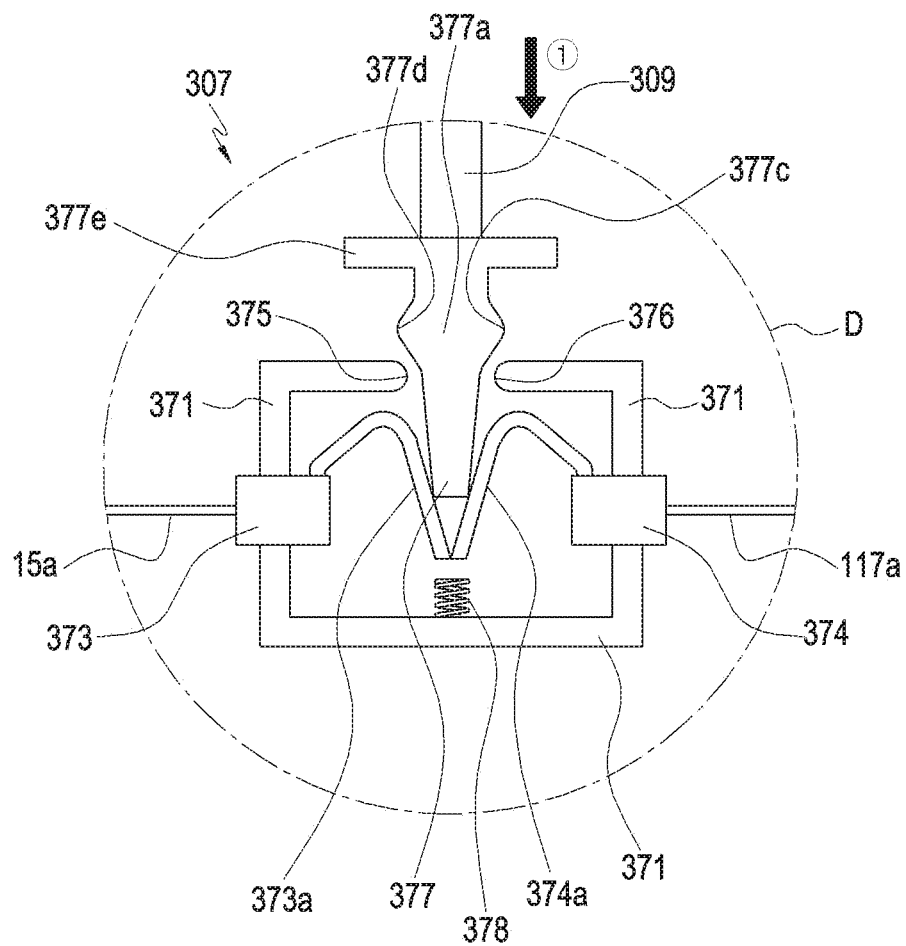
FIG. 18 is an enlarged view of a portion D illustrated in FIG. 9.
Figure 19:
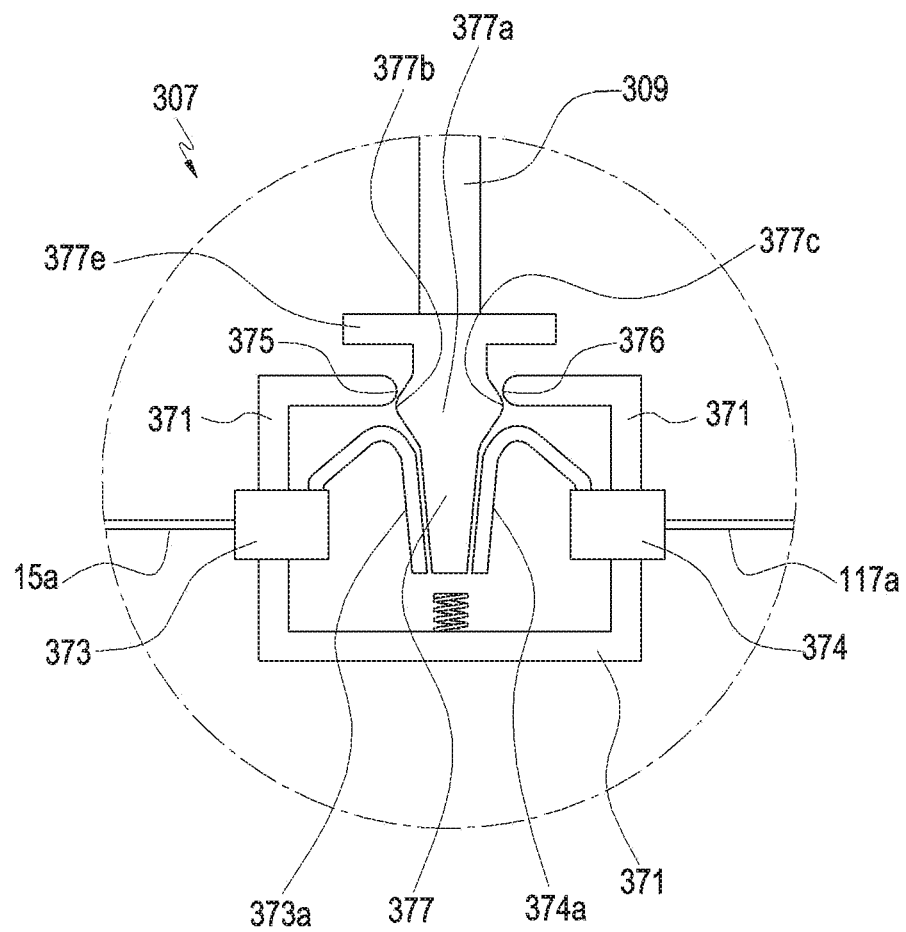
FIG. 19 is a view showing a state where a battery and a circuit board are electrically blocked by a switch of an electronic device, according to one embodiment of the present disclosure.

FIG. 18 is an enlarged view of a portion D illustrated in FIG. 9. FIG. 19 is a view showing a state where a battery (e.g., the battery 15 of FIG. 7) and a circuit board (e.g., the circuit board 117 of FIG. 7) are electrically blocked by a switch (e.g., a switch 307 of FIG. 9) of an electronic device, according to yet another one of various embodiments of the present disclosure.

Referring to FIGS. 18 and 19, a description will be made of a process in which an electrical connection between the battery (e.g., the battery 15 of FIG. 7) and the circuit board (e.g., the circuit board 117 of FIG. 7) is blocked. As the pin 309 presses the portion 377e of the movable member, the body 377a of the movable member may move along the first direction ①. The second locking portions 377c and 377d may move to the inside of the case 371 via the first locking portions 375 and 376 by an external force of the pin 309. The body 377a of the movable member may be arranged between the first terminal 373a and the second terminal 374a. As a contact of the first terminal 373a with the second terminal 374a is released by the body 377a of the movable member, the electrical connection between the battery and the circuit board may be blocked.

Figure 20:
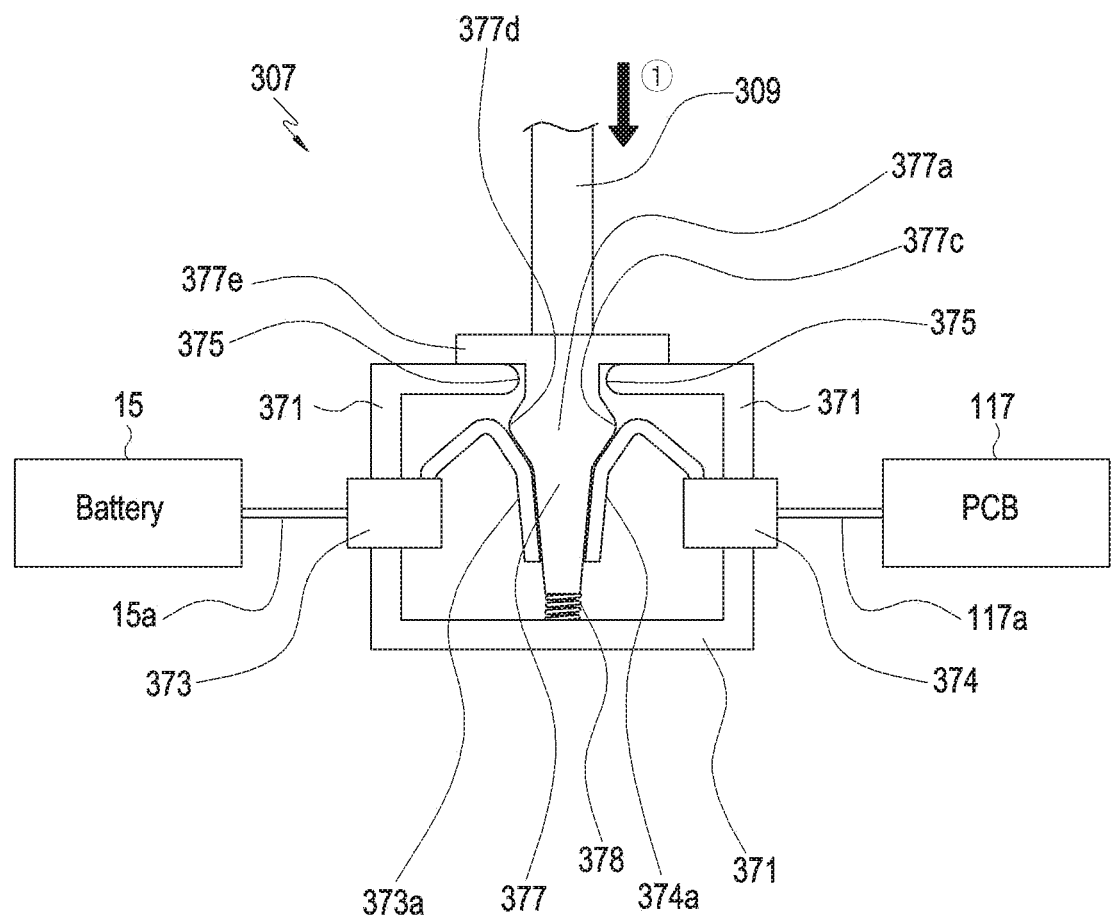
FIG. 20 is a view showing a state before a battery and a circuit board are electrically connected by a switch of an electronic device, according to one of various embodiments embodiment of the present disclosure.
Figure 21:
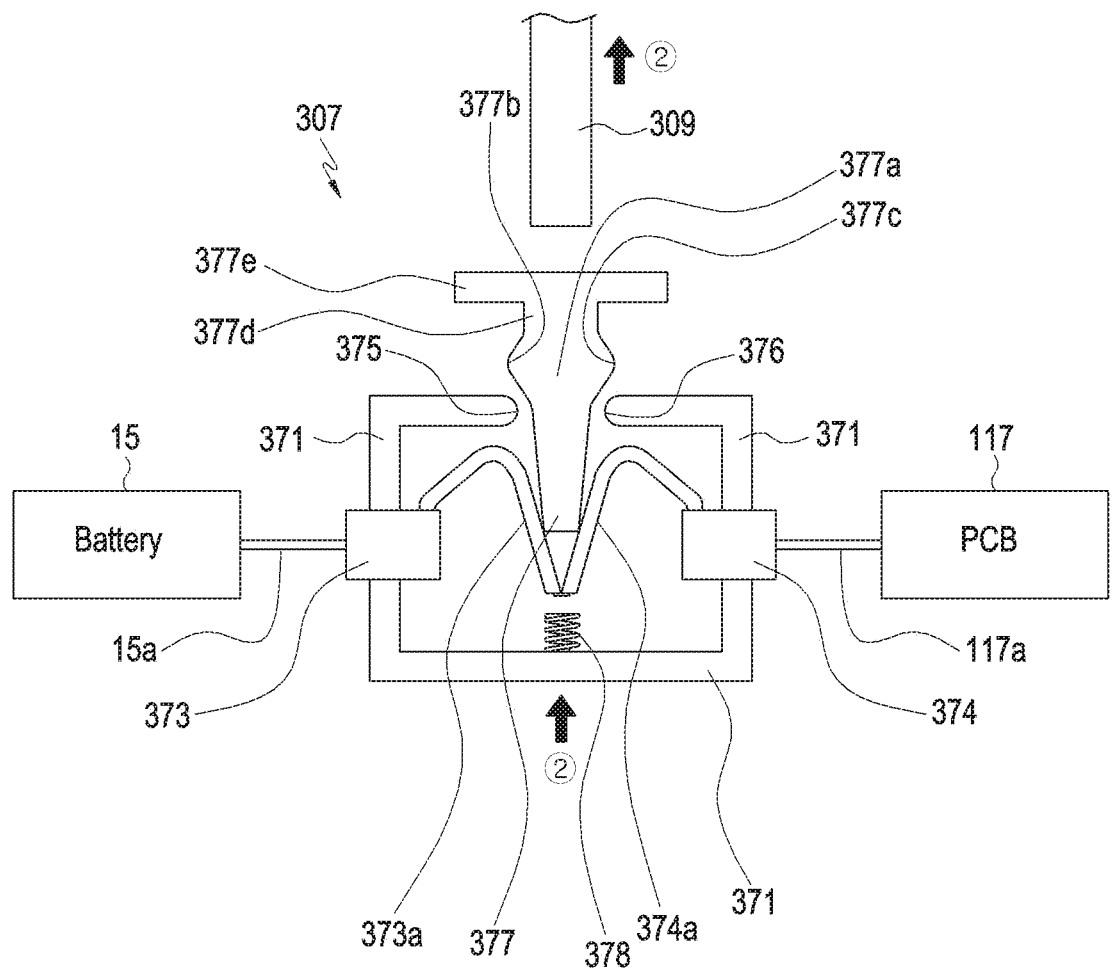
FIG. 21 is a view showing a state where a battery and a circuit board are electrically connected by a switch of an electronic device, according to one of various embodiments embodiment of the present disclosure.

FIG. 20 is a view showing a state before a battery (e.g., the battery 15 of FIG. 7) and a circuit board (e.g., the circuit board 117 of FIG. 7) are electrically blocked by a switch (e.g., a switch 307 of FIG. 9) of an electronic device, according to yet another one of various embodiments of the present disclosure. FIG. 21 is a view showing a state where a battery and a circuit board are electrically connected by a switch of an electronic device, according to yet another one of various embodiments of the present disclosure.

Referring to FIGS. 20 and 21, a description will be made of a process in which the battery (e.g., the battery 15 of FIG. 7) and the circuit board (e.g., the circuit board 117 of FIG. 7) are electrically connected again. As the pin 309 presses a switch (e.g., the portion 377e of the movable member), the body 377a of the movable member may move along the first direction ①. A face of the body 377a of the movable member may press the elastic member 378. The elastic force of the elastic member 378 may increase by pressurization made by the movable member 377. As the pin 309 moves along the second direction ②, the elastic member 378 having the increasing elastic force may press the movable member 377. The second locking portions 377c and 377d may be drawn out of the case 371 as locking of the first locking portions 375 and 376 is released by the elastic force of the elastic member 378. As the body 377a of the movable member moves away from between the first terminal 373a and the second terminal 374a, the first terminal 373a may contact the second terminal 374a. When the first terminal 373a contacts the second terminal 374a, the battery and the circuit board may be electrically connected again.

Figure 22:
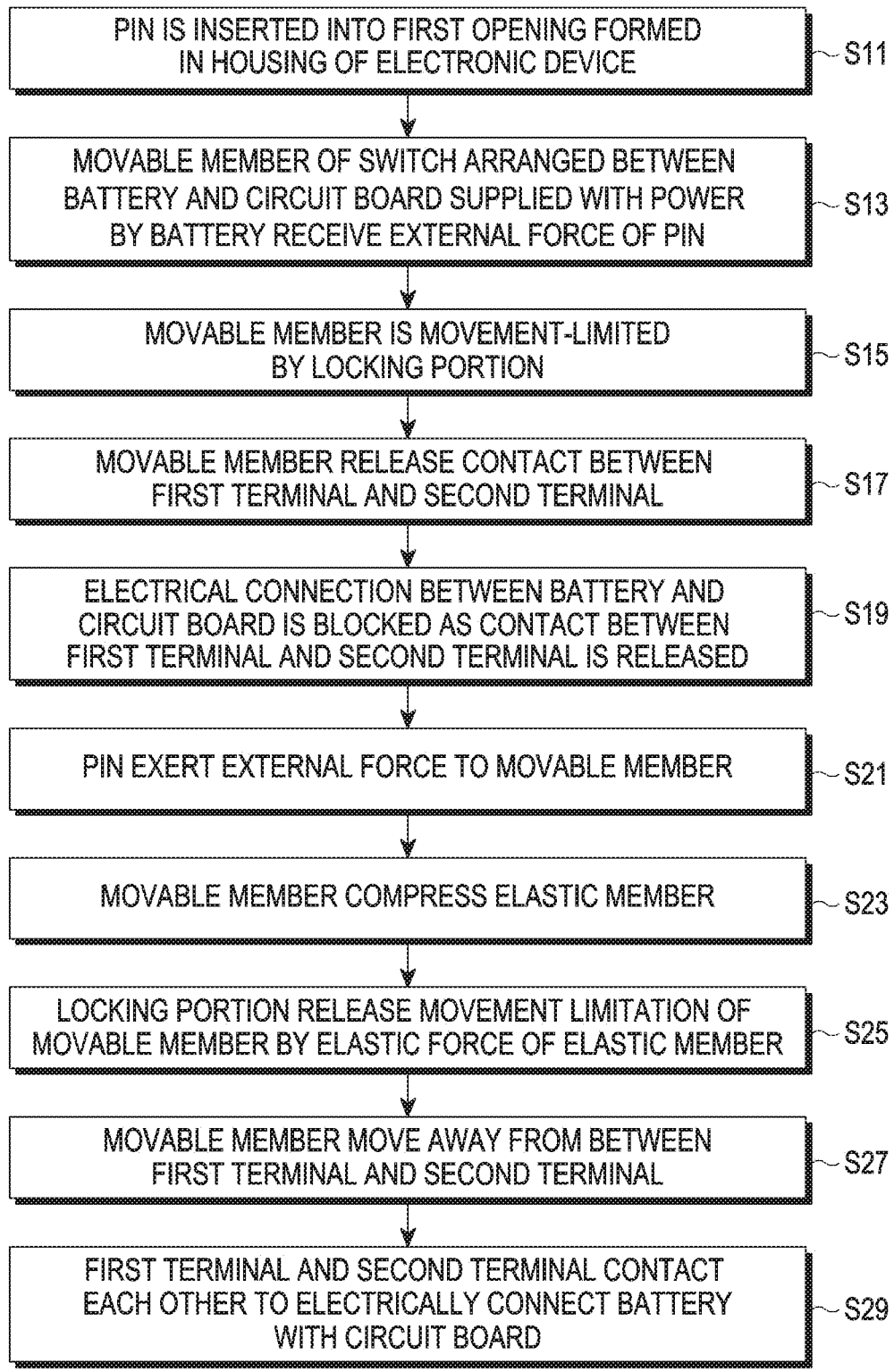
FIG. 22 is a flowchart illustrating a method for using an electronic device including an over-discharge preventing apparatus according to one of various embodiments embodiment of the present disclosure.

FIG. 22 is a flowchart illustrating a method for using an electronic device including an over-discharge preventing apparatus according to one of various embodiments of the present disclosure.

Referring to FIG. 22, a method for using an electronic device including an over-discharge preventing apparatus according to one of various embodiments of the present disclosure may include operation S11 of inserting a pin (e.g., the pin 309 of FIG. 4) into a first opening (e.g., the first opening 305 of FIG. 4) formed in a housing (e.g., the housing 301 of FIG. 4) of the electronic device (e.g., the electronic device 11 of FIG. 4), operation S13 in which a movable member (e.g., the movable member 377a of FIG. 18) of a switch arranged between a battery (e.g., the battery 15 of FIG. 7) and a circuit board (e.g., the circuit board 117 of FIG. 7) received with power from the battery (e.g., the battery 15 of FIG. 7) receives an external force of the pin (e.g., the pin 309 of FIG. 18), operation S15 in which movement of the movable member (e.g., the movable member 377a of FIG. 18) is limited by a locking portion (e.g., the locking portions 375, 376, 377c, and 377d of FIG. 7), operation S17 in which the movable member (e.g., the movable member 377a of FIG. 18) releases a contact between a first terminal (e.g., the first terminal 373a of FIG. 19) and a second terminal (e.g., the second terminal 374a of FIG. 19), operation S19 of blocking an electrical connection between the battery (e.g., the battery 15 of FIG. 7) and the circuit board (e.g., the circuit board 117 of FIG. 7) as the contact between the first terminal (e.g., the first terminal 373a of FIG. 19) and the second terminal (e.g., the second terminal 374a of FIG. 19) is released, operation S21 in which the pin (e.g., the pin 309 of FIG. 20) exerts an external force to the movable member (e.g., the movable member 377a of FIG. 20) again, operation S23 in which the movable member (e.g., the movable member 377a of FIG. 20) compresses an elastic member (e.g., the elastic member 378 of FIG. 20), operation S25 in which the locking portion (e.g., the locking portions 375, 376, 377c, and 377d of FIG. 20) releases limitation of movement of the movable member (e.g., the movable member 377a of FIG. 20) by an elastic force of the elastic force (e.g., the elastic force 378 of FIG. 20), operation S27 in which the movable member (e.g., the movable member 377a of FIG. 21) moves away from between the first terminal (e.g., the first terminal 373a of FIG. 21) and the second terminal (e.g., the second terminal 374a of FIG. 21), and operation S29 of electrically connecting the battery (e.g., the battery 15 of FIG. 7) with the circuit board (e.g., the circuit board 117 of FIG. 7) as the first terminal (e.g., the first terminal 373a of FIG. 21) and the second terminal (e.g., the second terminal 374a of FIG. 21) contact each other.

The operation in which the movable member (e.g., the movable member 377a of FIG. 18) releases the contact between the first terminal (e.g., the first terminal 373a of FIG. 19) and the second terminal (e.g., the second terminal 374a of FIG. 19) may include an operation in which the movable member (e.g., the movable member 377a of FIG. 18) is inserted between the first terminal (e.g., the first terminal 373a of FIG. 19) electrically connected with the battery (e.g., the battery 15 of FIG. 7) and the second terminal (e.g., the second terminal 374a of FIG. 19) electrically connected with the circuit board (e.g., the circuit board 117 of FIG. 7).

Figure 23:
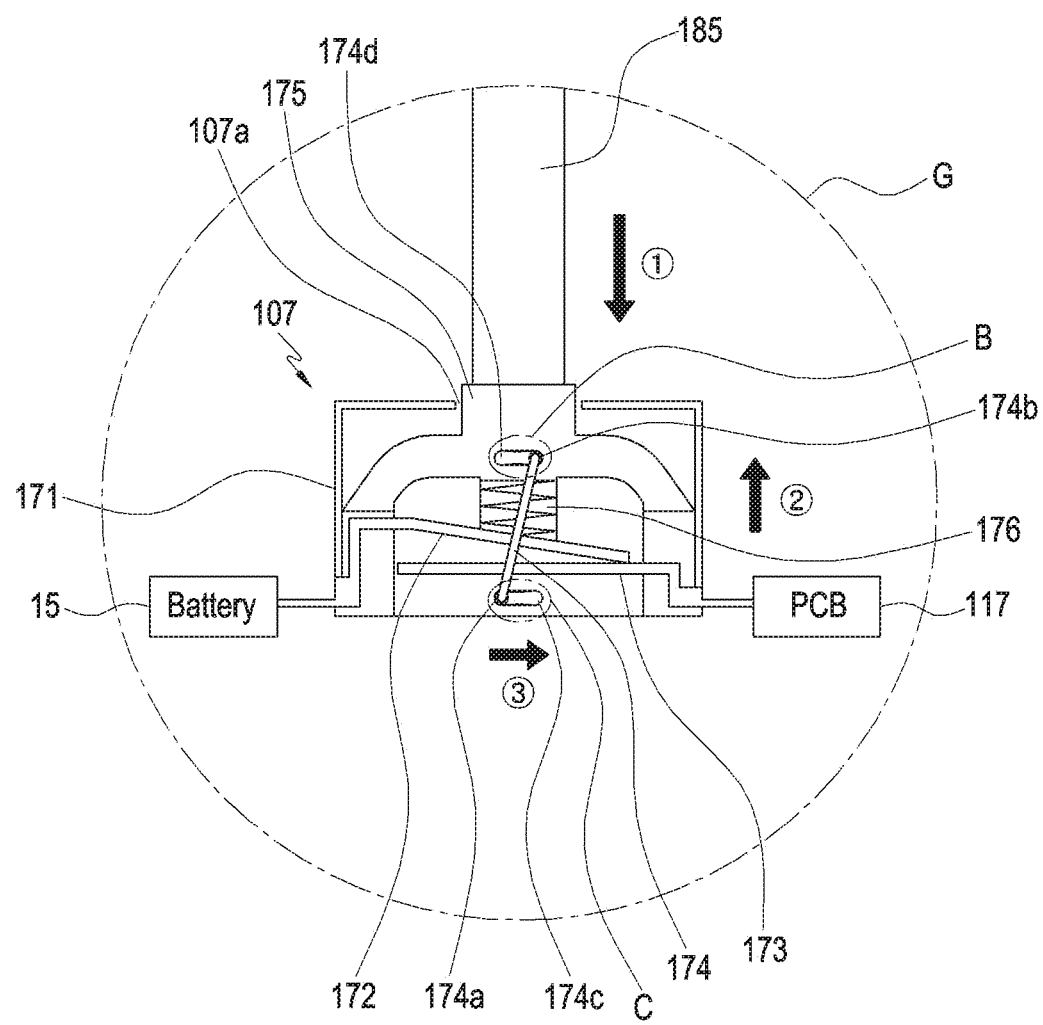
FIG. 23 is an enlarged view of a portion G of FIG. 15 to show a switch of an electronic device according to yet another one of various embodiments embodiment of the present disclosure.
Figure 24:
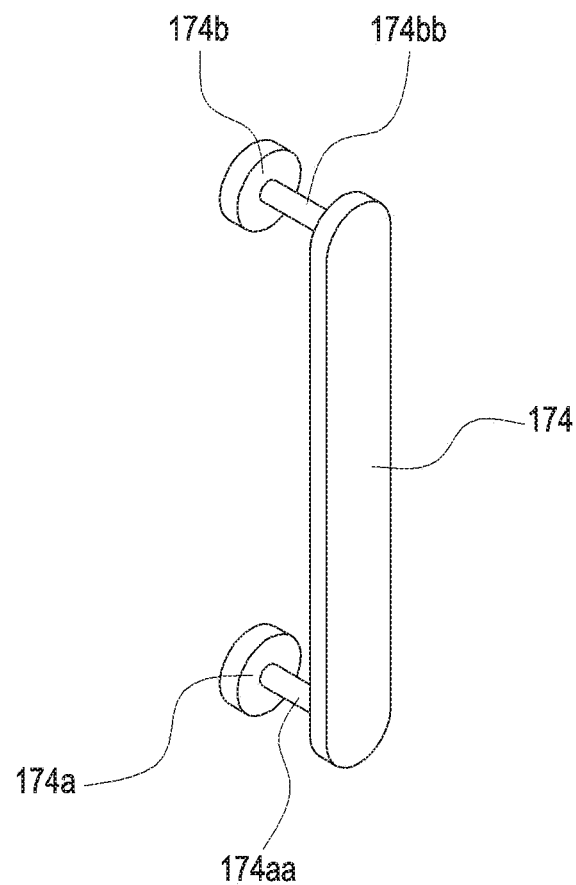
FIG. 24 is a perspective view showing a rod and first and second rollers of a switching configuration of an electronic device according to one embodiment of the present disclosure.
Figure 25:
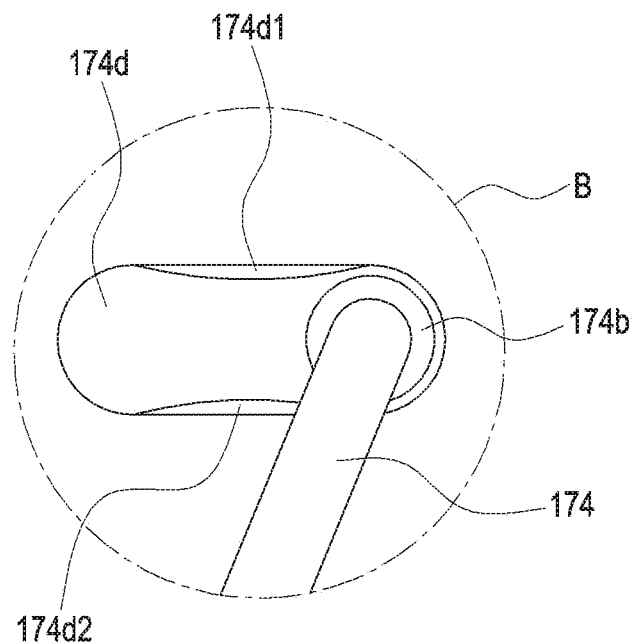
FIG. 25 is an enlarged view of a portion B of FIG. 23.
Figure 26:
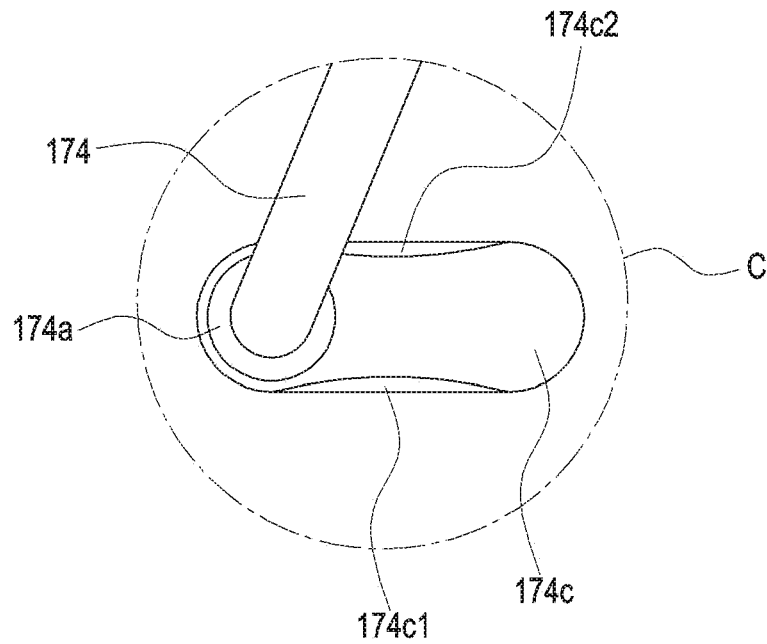
FIG. 26 is an enlarged view of a portion C of FIG. 23.

FIG. 23 is an enlarged view of a portion G of FIG. 15 to show a switch (e.g., the switch 107 of FIG. 12) of an electronic device (e.g., the electronic device 11 of FIG. 12), according to yet another one of various embodiments of the present disclosure. FIG. 24 is a perspective view showing a rod 174 and first and second rollers 174a and 174b of a switching configuration of an electronic device, according to yet another one of various embodiments of the present disclosure. FIG. 25 is an enlarged view of a portion B of FIG. 23. FIG. 26 is an enlarged view of a portion C of FIG. 23.

Referring to FIGS. 23 through 26, the switch 107 of the electronic device according to one of various embodiments of the present disclosure may include a case 171, a first terminal 172, a second terminal 173, a movable member 175, an elastic member 176, and locking portions 174, 174a, 174b, 174c, and 174d.

According to an embodiment of the present disclosure, the case 171 may be arranged inside a housing (e.g., the housing 101 of FIG. 15). A case hole 107a may be formed in a face of the case 107.

According to an embodiment of the present disclosure, the first terminal 172 may be included inside the case 171, and may be electrically connected with the battery 15. The second terminal 173 may be provided inside the case 171, and may be electrically connected with the circuit board 117. The first terminal 172 and the second terminal 173 may include a conductive material having elasticity. For example, the first terminal 172 and the second terminal 173 may include a metal material such as copper, etc. The first terminal 172 may be arranged on the second terminal 173. According to various embodiments of the present disclosure, the first terminal 172 is not limited to being arranged on the second terminal 173 but may be disposed under the second terminal 173.

According to an embodiment of the present disclosure, the movable member 175 may reciprocate inside the case 171. A portion of the movable member 175 may be exposed to the outside through the case hole 107a. The portion of the movable member 175 may contact the extending portion 185 of the push bar.

According to an embodiment of the present disclosure, the elastic member 176 may be arranged between the first terminal 172 and the movable member 175. The elastic member 176 may press the first terminal 172 as the movable member 175 moves along the first direction ①. The elastic member 176 may have a spring form. According to various embodiments of the present disclosure, the elastic member 176 is not limited to the spring form and may have various structures having an elastic force.

According to an embodiment of the present disclosure, the locking portions 174, 174a, 174b, 174c, and 174d may include a first locking groove 174d, a second locking groove 174c, the rod 174, the first roller 174b, and the second roller 174a.

According to an embodiment of the present disclosure, the first locking groove 174d may be formed in the movable member 175. As shown in FIG. 25, the first locking groove 174d may include first protruding portions 174d1 and 174d2. The second locking groove 174c may be formed in the case 107. As shown in FIG. 26, the second locking groove 174c may include second protruding portions 174c1 and 174c2. The rod 174 may perform connection between the first locking groove 174d and the second locking groove 174c.

According to an embodiment of the present disclosure, as shown in FIG. 24, the first roller 174b may rotate by being connected with a first rotation shaft 174bb formed on a first end of the rod 174. The first roller 174b may be inserted into the first locking groove 174d. As shown in FIG. 25, as the first roller 174b moves along the first locking groove 174d, movement of the first roller 174b may be limited by the first protruding portions 174d1 and 174d2.

According to an embodiment of the present disclosure, as shown in FIG. 24, the second roller 174a may rotate by being connected with a second rotation shaft 174aa formed on a second end of the rod 174. The second roller 174a may be inserted into the second locking groove 174c. As shown in FIG. 26, as the first roller 174a moves along the second locking groove 174c, movement of the first roller 174a may be limited by the second protruding portions 174c1 and 174c2.

Figure 27:
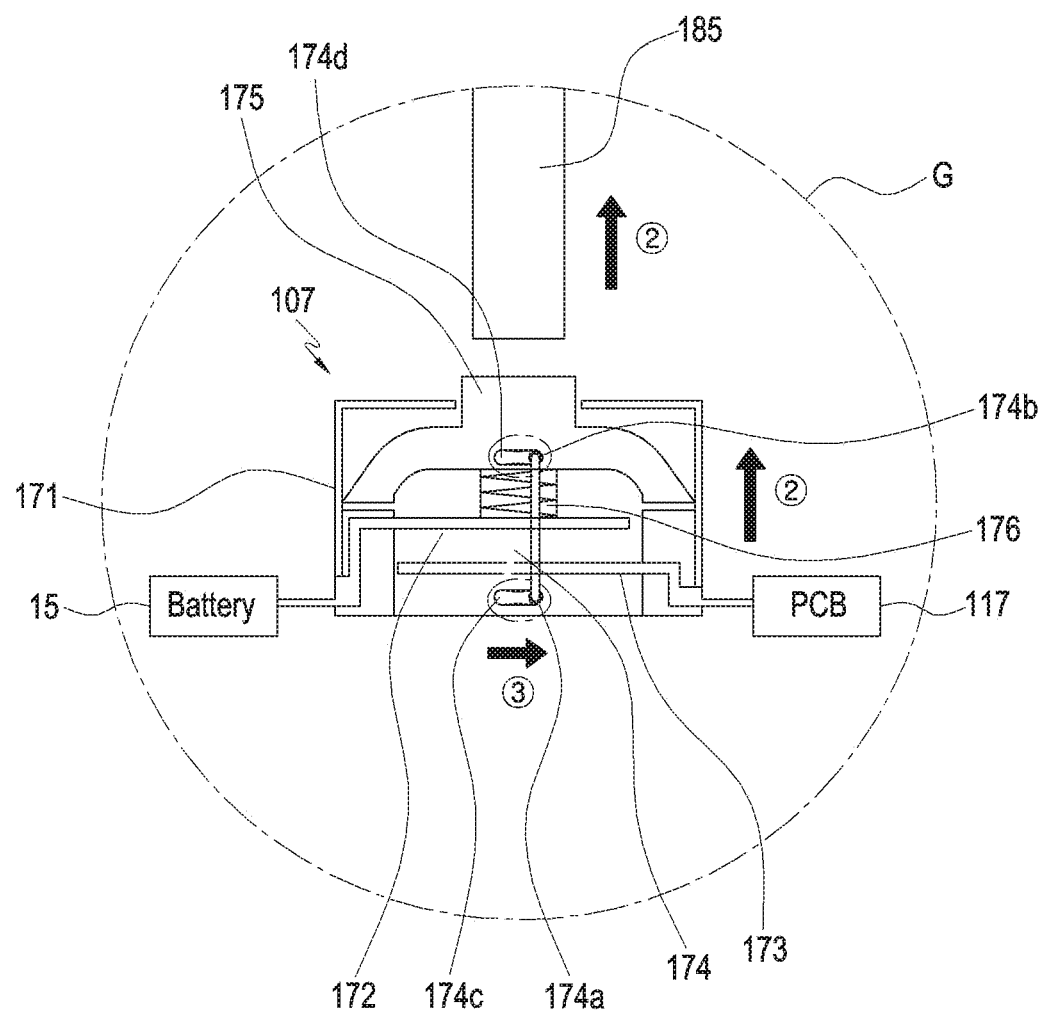
FIG. 27 is an enlarged view of a portion G of FIG. 15 to show a state where a battery and a circuit board are electrically blocked by a switch of an electronic device, according to one embodiment of the present disclosure.

FIG. 27 is an enlarged view of a portion G of FIG. 15 to show a state where the battery 15 and the circuit board 117 are electrically blocked by a switch (e.g., the switch 107 of FIG. 15) of an electronic device, according to yet another one of various embodiments of the present disclosure.

Referring to FIGS. 23 and 27, a description will be made of a process in which an electrical connection between the battery 15 and the circuit board 117 is blocked. When the pin (109 of FIG. 16) is inserted through the first opening (105 of FIG. 16), the pin 109 may move the push bar 108 along the first direction ①. The extending portion 185 of the push bar 108 may press a face of the movable member 175 of the switch.

According to an embodiment of the present disclosure, the elastic member 108 may further press the elastic member 176 while moving along the first direction ①. The elastic force of the elastic member 176 may further increase by pressurization made by the movable member 108. As the elastic member 176 exerts an elastic force along the second direction ②, the movable member 108 may receive a force for being moved along the second direction ②. By the force through which the movable member 108 is moved along the second direction ② locking of the second roller 174a is released from the second locking groove 174c such that the second roller 174a may be moved along a third direction ③. As the second roller 174a is moved from the second locking groove 174c along the third direction ③, the rod 174 may be parallel to the second direction ② by means of the elastic force of the elastic member 176. As the rod 174 becomes parallel to the second direction ②, the movable member 108 may be moved by the elastic force of the elastic member 176 along the second direction ②. As the movable member 108 is moved along the second direction ②, pressurization of the elastic member 176 with respect to the first terminal 172 is released, such that the contact of the first terminal 172 with the second terminal 173 may be released. When a contact of the first terminal 172 with the second terminal 173 is released, an electrical connection between the battery 15 and the circuit board 117 may be blocked.

Figure 28:
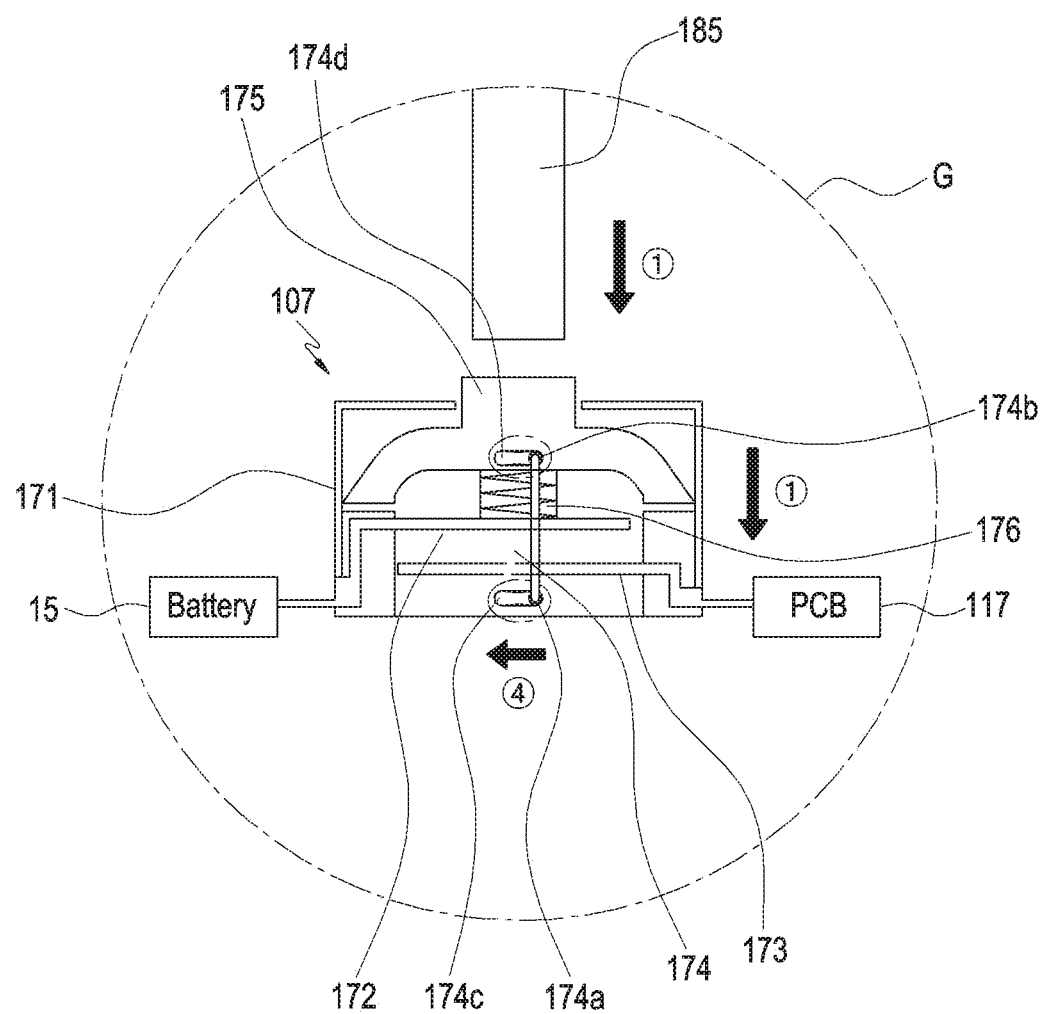
FIG. 28 is a view showing a state before a switch of an electronic device is pressed by a pin, according to one embodiment of the present disclosure.
Figure 29:
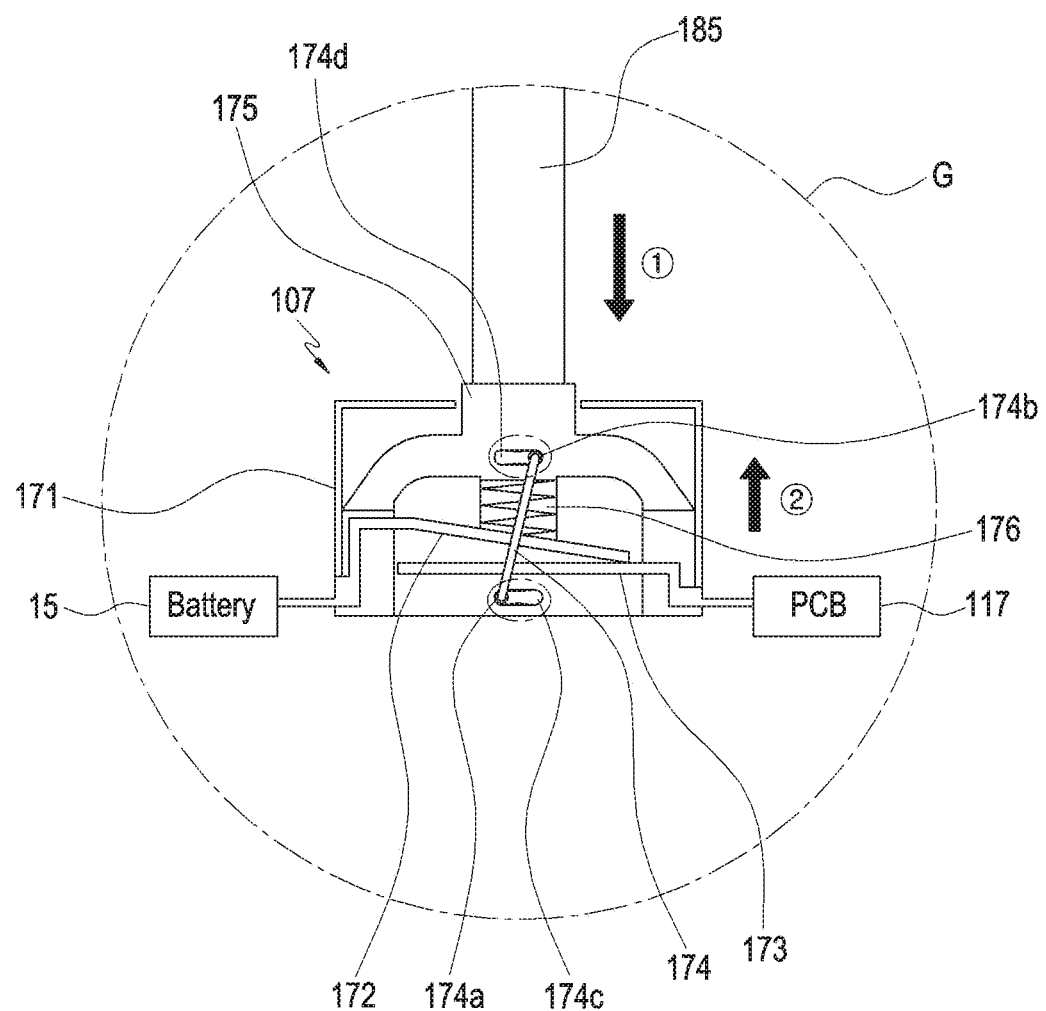
FIG. 29 is a view showing a state where a battery and a circuit board are electrically connected by a switch of an electronic device, according to one embodiment of the present disclosure.

FIG. 28 is a view showing a state before a switch (e.g., the switch 107 of FIG. 15) of an electronic device is pressed by a pin (e.g., the pin 109 of FIG. 15), according to yet another one of various embodiments of the present disclosure. FIG. 29 is a view showing a state where the battery 15 and the circuit board 117 are electrically connected by a switch of an electronic device, according to yet another one of various embodiments of the present disclosure.

Referring to FIGS. 28 and 29, a description will be made of a process in which the battery 15 and the circuit board 117 are electrically connected. Once a pin (e.g., the pin 109 of FIG. 15) is inserted into a first opening (e.g., the first opening 105 of FIG. 15), the pin (e.g., the pin 109 of FIG. 15) may press a push bar (e.g., the push bar 108 of FIG. 15). The extending portion 185 of the push bar may press the movable member 175 of the switch 107 along the first direction ①.

According to an embodiment of the present disclosure, the movable member 175 may press the elastic member 176 while moving along the first direction ①. As the elastic member 176 presses the first terminal 172, the first terminal 172 may contact the second terminal 173. As the movable member 175 is moved, the rod 174 may be moved from the second locking groove 174c along a fourth direction ④ that is opposite the third direction. The second roller 174a may be moved along the fourth direction ④ via the second protruding portions 174c1 and 174c2 of FIG. 26. As the extending portion 185 of the push bar is moved along the second direction ②, the elastic member 176 may apply an elastic force for moving the movable member 175 along the second direction ②. The second roller 174a may be locked by the second protruding portions 174c1 and 174c2 of FIG. 26, such that the rod 174 may limit movement of the movable member 175 along the second direction ②. As the first terminal 172 maintains a contact with the second terminal 173, the battery 15 may be electrically connected with the circuit board 117.

Figure 30:
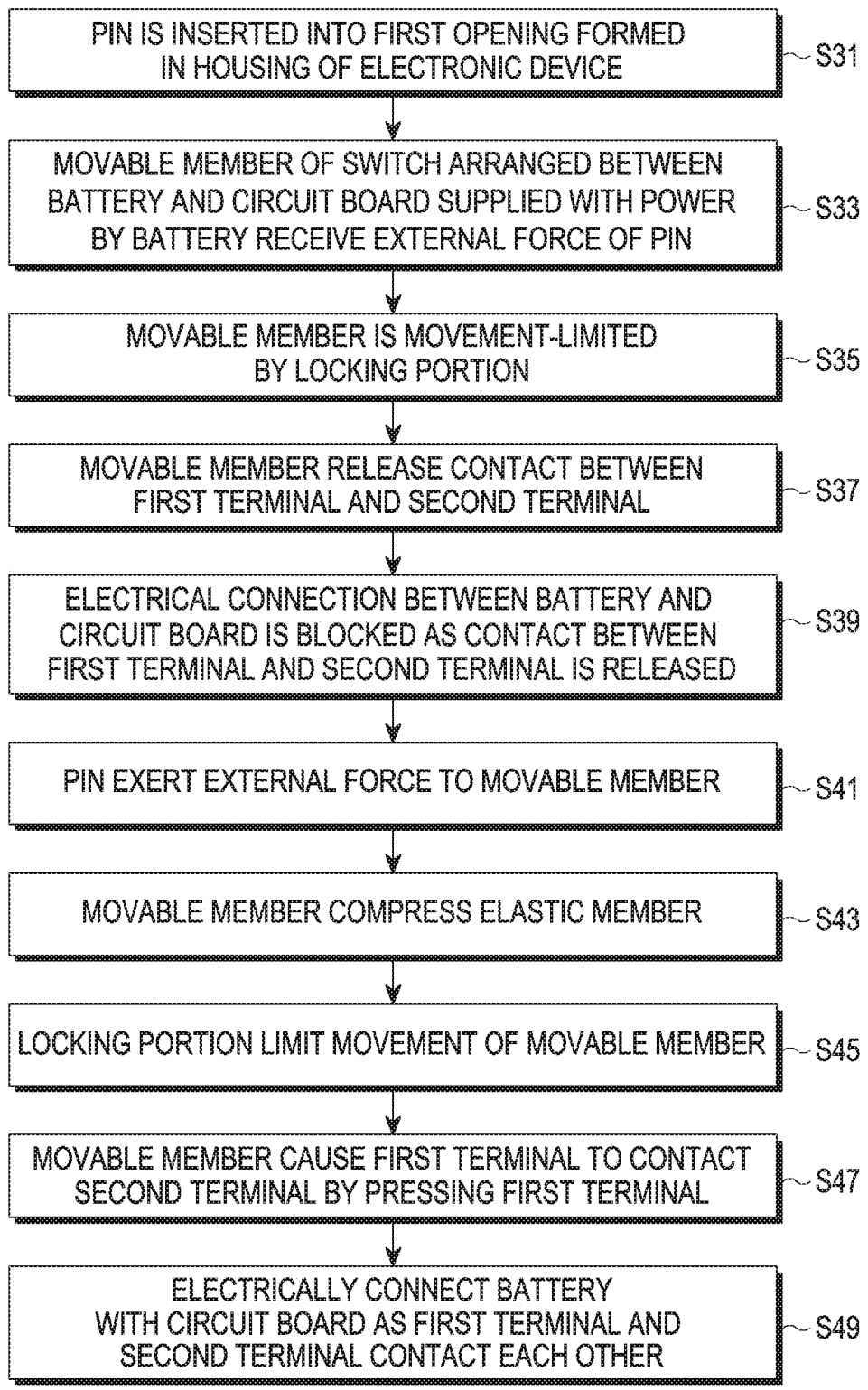
FIG. 30 is a flowchart showing a method for using an electronic device, according to one embodiment of the present disclosure.

FIG. 30 is a flowchart illustrating a method for using an electronic device according to various embodiments of the present disclosure.

Referring to FIG. 30, a method for using an electronic device that prevents over-discharge of a battery according to one of various embodiments of the present disclosure may include operation S31 of inserting a pin (e.g., the pin 109 of FIG. 12) into a first opening (e.g., the first opening 105 of FIG. 12) formed in a housing (e.g., the housing 101 of FIG. 12) of the electronic device (e.g., the electronic device 11 of FIG. 12), operation S33 in which a movable member (e.g., the movable member 175 of FIG. 23) of a switch (e.g., the switch 107 of FIG. 23) arranged between a battery (e.g., the battery 15 of FIG. 23) and a circuit board (e.g., the circuit board 117 of FIG. 23) received with power from the battery receives an external force from the battery (e.g., the battery 117 of FIG. 23) receives an external force of the pin (e.g., the pin 109 of FIG. 15), operation S35 in which movement of the movable member (e.g., the movable member 175 of FIG. 23) is limited by a locking portion (e.g., the locking portions 174, 174a, 174b, 174c, and 174d of FIG. 23), operation S37 in which the movable member (e.g., the movable member 175 of FIG. 27) releases a contact between a first terminal (e.g., the first terminal 172 of FIG. 27) and a second terminal (e.g., the second terminal 173 of FIG. 27), operation S39 of blocking an electrical connection between the battery (e.g., the battery 15 of FIG. 27) and the circuit board (e.g., the circuit board 117 of FIG. 27) as the contact between the first terminal (e.g., the first terminal 172 of FIG. 27) and the second terminal (e.g., the second terminal 173 of FIG. 27) is released, operation S41 in which the pin (e.g., the pin 109 of FIG. 15) exerts an external force to the movable member (e.g., the movable member 175 of FIG. 28) again, operation S43 in which the movable member (e.g., the movable member 175 of FIG. 28) compresses an elastic member (e.g., the elastic member 176 of FIG. 28), operation S45 in which the locking portion (e.g., the locking portions 174, 174a, 174b, 174c, and 174d of FIG. 28) limits movement of the movable member (e.g., the movable member 175 of FIG. 28), operation S47 in which the movable member (e.g., the movable member 175 of FIG. 29) causes the first terminal (e.g., the first terminal 172 of FIG. 29) and the second terminal (e.g., the second terminal 173 of FIG. 29) to contact each other by pressing the first terminal (e.g., the first terminal 172 of FIG. 29), and operation S49 of electrically connecting the battery (e.g., the battery 15 of FIG. 29) with the circuit board (e.g., the circuit board 117 of FIG. 29) as the first terminal (e.g., the first terminal 172 of FIG. 29) and the second terminal (e.g., the second terminal 173 of FIG. 29) contact each other.

According to an embodiment of the present disclosure, the operation in which the movable member (e.g., the movable member 175 of FIG. 27) releases the contact between the first terminal (e.g., the first terminal 172 of FIG. 27) and the second terminal (e.g., the second terminal 173 of FIG. 27) may include an operation in which the movable member (e.g., the movable member 377a of FIG. 27) releases pressing of the first terminal (e.g., the first terminal 172 of FIG. 27) as locking of the locking portion (e.g., the locking portions 174, 174a, 174b, 174c, and 174d of FIG. 23) is released.

While embodiments of the present disclosure have been described, various changes may be made without departing the scope of the present disclosure.

The invention claimed is:

1. An electronic device comprising an over-discharge preventing apparatus, the electronic device comprising:
   a housing comprising a first opening and a second opening;
   a first electronic component arranged inside the housing;
   a second electronic component electrically connected with the first electronic component;
   a switch configured to electrically connect the first electronic component with the second electronic component or block an electrical connection between the first electronic component and the second electronic component, by an external force exerted by a pin inserted through the first opening;
   a tray inserted into or drawn out of the housing through the second opening; and
   a push bar configured to receive the external force from the pin inserted into the first opening and deliver a force to press the switch,
   wherein the switch comprises:
      a first terminal electrically connected with the first electronic component,
      a second terminal electrically connected with the second electronic component, and
      a movable member blocking an electrical connection between the first electronic component and the second electronic component by being inserted between the first terminal and the second terminal, or electrically connecting the first electronic component with the second electronic component by moving away from between the first terminal and the second terminal.

2. The electronic device of claim 1, wherein the first electronic component comprises a battery, and the second electronic component comprises a circuit board.

3. The electronic device of claim 1, wherein the switch further comprises:
   a case arranged inside the housing;
   a locking portion configured to cause the first terminal to contact the second terminal or release the contact, by limiting movement of the movable member; and
   an elastic member configured to provide an elastic force to the movable member,
   wherein the locking portion comprises:
      a first locking portion formed in the case; and
      a second locking portion formed on the movable member and locked in the first locking portion to limit movement of the movable member.

4. The electronic device of claim 3, wherein the movable member comprises a body having a longitudinal direction, and the second locking portion protrudes from an outer surface of the body.

5. The electronic device of claim 4, wherein as the elastic member is pressed by the body receiving the external force of the pin, the second locking portion is configured to leave the first locking portion such that a portion of the body is moved to an outside of the case in a direction that is opposite the external force of the pin.

6. The electronic device of claim 1,
   wherein the housing further comprises a first face facing a first direction and a second face facing a second direction that is opposite the first direction, the housing further comprising the first opening formed between the first face and the second face,
   wherein the first electronic component is a battery arranged inside the housing,
   wherein the second electronic component is a circuit board configured to receive power from the battery, and
   wherein the switch is further configured to electrically connect the battery with the circuit board or to block an electrical connection between the battery and the circuit board, by the external force exerted by the pin inserted through the first opening.

7. The electronic device of claim 6, further comprising the tray capable of accommodating a subscriber identification module (SIM) card or a memory card and configured to be inserted into or drawn out of the housing,
   wherein the first opening is configured to provide a path for manipulating the tray to be ejected.

8. The electronic device of claim 7, further comprising a socket arranged inside the housing and removably coupling the tray,
   wherein the switch is arranged in the socket.

9. The electronic device of claim 6, further comprising:
   a lever configured to receive a force from the push bar and drawing the tray out of the housing,
   wherein the push bar comprises:
      a push bar head comprising a first push bar hole connected with the first opening, and
      a push bar body comprising a second push bar hole connecting the first push bar hole with the switch,
   wherein the switch is further configured to be pressed by the pin via the first push bar hole and the second push bar hole, and wherein the lever comprises a lever hole connected with the first push bar hole and the second push bar hole and into which the pin is inserted.

10. The electronic device of claim 9, wherein the push bar further comprises the first push bar hole, and the second push bar hole into which the pin is inserted in such a way that the first opening and the switch are connected with each other, and
wherein a length of the pin is greater than a length of the push bar.

11. The electronic device of claim 6, wherein the switch further comprises:
the first terminal electrically connected with the battery;
the second terminal electrically connected with the circuit board; and
the movable member electrically connecting the battery with the circuit board by causing the first terminal to contact the second terminal as the first terminal is pressed by the external force of the pin inserted into the first opening, or blocking an electrical connection between the battery and the circuit board by releasing the contact between the first terminal and the second terminal as pressing of the first terminal is released.

12. The electronic device of claim 11, wherein the switch further comprises:
a case arranged inside the housing;
a locking portion configured to cause the first terminal to contact the second terminal or release the contact, by limiting movement of the movable member; and
an elastic member arranged between the first terminal and the movable member,
wherein the first terminal or the second terminal is configured to be bent by pressing that is caused by an elastic force of the elastic member.

13. The electronic device of claim 12, wherein the locking portion comprises:
a first locking groove formed in the movable member and comprising a first protruding portion;
a second locking groove formed in the case and comprising a second protruding portion;
a rod connecting the first locking groove with the second locking groove;
a first roller rotatably connected with a first end of the rod and being movement-limited by the first protruding portion as moving along the first locking groove; and
a second roller rotatably connected with a second end of the rod and being movement-limited by the second protruding portion as moving along the second locking groove.

* * * * *